United States Patent
Ginetti

(10) Patent No.: US 10,776,555 B1
(45) Date of Patent: Sep. 15, 2020

(54) METHODS, SYSTEMS, AND COMPUTER PROGRAM PRODUCT FOR IMPLEMENTING LEGAL ROUTING TRACKS ACROSS VIRTUAL HIERARCHIES AND LEGAL PLACEMENT PATTERNS

(71) Applicant: Cadence Design Systems, Inc., San Jose, CA (US)

(72) Inventor: Arnold Ginetti, Antibes (FR)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/388,788

(22) Filed: Apr. 18, 2019

Related U.S. Application Data

(62) Division of application No. 15/283,052, filed on Sep. 30, 2016, now Pat. No. 10,282,505.

(51) Int. Cl.
| | | |
|---|---|---|
| *G06F 17/50* | (2006.01) | |
| *G06F 30/394* | (2020.01) | |
| *G06F 30/392* | (2020.01) | |
| *G06F 30/398* | (2020.01) | |
| *G06F 30/3947* | (2020.01) | |
| *G06F 30/3953* | (2020.01) | |

(52) U.S. Cl.
CPC .......... *G06F 30/394* (2020.01); *G06F 30/392* (2020.01); *G06F 30/398* (2020.01); *G06F 30/3947* (2020.01); *G06F 30/3953* (2020.01)

(58) Field of Classification Search
CPC .... G06F 30/394; G06F 30/392; G06F 30/398; G06F 30/3947; G06F 30/3953
USPC .............. 716/122, 124, 130, 131, 136, 129; 703/15
See application file for complete search history.

(56) References Cited

U.S. PATENT DOCUMENTS

| | | | |
|---|---|---|---|
| 5,008,882 A | 4/1991 | Peterson | |
| 5,568,396 A | 10/1996 | Bamji | |
| 5,581,474 A | 12/1996 | Bamji | |
| 5,604,680 A | 2/1997 | Bamji | |
| 6,256,768 B1 | 7/2001 | Igusa | |
| 6,289,412 B1 | 9/2001 | Yuan | |
| 6,507,932 B1 | 1/2003 | Landry | |
| 6,507,941 B1 | 1/2003 | Leung | |
| 6,516,456 B1 | 2/2003 | Garnett | |

(Continued)

OTHER PUBLICATIONS

Non-Final Office Action dated Nov. 27, 2017 for U.S. Appl. No. 15/282,778.

(Continued)

*Primary Examiner* — Phallaka Kik
(74) *Attorney, Agent, or Firm* — Vista Law Group, LLP

(57) ABSTRACT

Disclosed are methods, systems, and articles of manufacture for implementing legal routing tracks across virtual hierarchies and legal placement patterns. These techniques execute a sequence of instructions to identify at least a layout or a portion thereof and identify a plurality of layout devices in the layout or the portion thereof. These techniques further generate a figure group at least by enclosing the plurality of layout devices within a boundary for the figure group. These techniques may modify layout devices in a placement row without disturbing compliance of one or more design rules with which the legal device pattern complies when generated.

20 Claims, 17 Drawing Sheets

---

202B IDENTIFY A LAYOUT OR A PORTION THEREOF

204B OPTIONALLY INVOKE A PLACEMENT ENGINE TO PLACE A PLURALITY OF LAYOUT DEVICES IN THE FLAT LAYOUT PORTION BASED ON A SET OF RULES

206B CREATE A FIGURE GROUP USING A BOUNDARY AT A VIRTUAL HIERARCHY FOR A LEGAL DEVICE PATTERN FOR THE PLURALITY OF LAYOUT DEVICES

208B MODIFY A ROW IN THE LEGAL DEVICE PATTERN WITHOUT DISTURBING COMPLIANCE OF DESIGN RULE(S) OF THE LEGAL DEVICE PATTERN

(56) References Cited

U.S. PATENT DOCUMENTS

| | | | |
|---|---|---|---|
| 6,629,304 B1* | 9/2003 | Gasanov | G06F 30/392 |
| | | | 716/122 |
| 6,738,957 B2 | 5/2004 | Gont | |
| 7,062,475 B1 | 6/2006 | Szabo | |
| 7,065,729 B1 | 6/2006 | Chapman | |
| 7,117,468 B1 | 10/2006 | Teig | |
| 7,117,473 B1 | 10/2006 | Knol | |
| 7,120,892 B1 | 10/2006 | Knol | |
| 7,146,595 B2 | 12/2006 | Knol | |
| 7,310,793 B1 | 12/2007 | Teig | |
| 7,418,686 B1 | 8/2008 | Knol | |
| 7,469,255 B2 | 12/2008 | Kusterer | |
| 7,478,352 B2 | 1/2009 | Chaplin | |
| 7,555,739 B1 | 6/2009 | Ginetti et al. | |
| 7,710,420 B2 | 5/2010 | Nonclercq | |
| 7,805,698 B1 | 9/2010 | Ferguson | |
| 7,810,064 B2 | 10/2010 | Ladin | |
| 7,865,857 B1 | 1/2011 | Chopra | |
| 7,921,096 B2 | 4/2011 | Allen | |
| 7,949,983 B2 | 5/2011 | Eshun | |
| 8,028,243 B1 | 9/2011 | O'Riordan | |
| 8,255,845 B2 | 8/2012 | Ginetti | |
| 8,271,920 B2 | 9/2012 | Cho et al. | |
| 8,375,348 B1 | 2/2013 | Raj | |
| 8,438,530 B2 | 5/2013 | Giffel | |
| 8,527,890 B2 | 9/2013 | Harada | |
| 8,560,998 B1 | 10/2013 | Salowe | |
| 8,595,237 B1 | 11/2013 | Chaudhary | |
| 8,640,078 B2 | 1/2014 | Majumder | |
| 8,640,079 B2 | 1/2014 | Majumder | |
| 8,671,368 B1 | 3/2014 | Salowe | |
| 8,839,174 B2 | 9/2014 | Suiter | |
| 8,930,863 B2 | 1/2015 | Nayak et al. | |
| 9,003,349 B1 | 4/2015 | Salowe | |
| 9,129,081 B2 | 9/2015 | Ginetti | |
| 9,141,746 B1 | 9/2015 | Ginetti | |
| 9,182,948 B1 | 11/2015 | O'Riordan | |
| 9,208,273 B1 | 12/2015 | Morlat | |
| 9,223,915 B1 | 12/2015 | Ginetti | |
| 9,317,650 B2 | 4/2016 | Chen | |
| 9,396,301 B1 | 7/2016 | Lee | |
| 9,652,579 B1 | 5/2017 | Arkhipov | |
| 9,659,138 B1 | 5/2017 | Powell | |
| 9,779,193 B1 | 10/2017 | Ginetti | |
| 9,842,178 B2 | 12/2017 | Ferguson | |
| 9,904,756 B1 | 2/2018 | Ruehl | |
| 9,934,354 B1 | 4/2018 | Kukal | |
| 10,025,801 B2 | 7/2018 | Kaufman | |
| 10,515,177 B1* | 12/2019 | Ruehl | G06F 30/00 |
| 2003/0101331 A1 | 5/2003 | Boylan | |
| 2004/0078770 A1* | 4/2004 | Miller | G06F 30/392 |
| | | | 716/122 |
| 2004/0083210 A1 | 4/2004 | Ochiai | |
| 2004/0088118 A1 | 5/2004 | Jensen | |
| 2004/0088487 A1 | 5/2004 | Barroso et al. | |
| 2005/0091627 A1 | 4/2005 | Satapathy | |
| 2005/0120316 A1 | 6/2005 | Suaya | |
| 2005/0138591 A1 | 6/2005 | Shirai | |
| 2006/0184540 A1 | 8/2006 | Kung | |
| 2006/0190889 A1* | 8/2006 | Cong | G06F 30/392 |
| | | | 716/122 |
| 2006/0200789 A1 | 9/2006 | Rittman | |
| 2006/0218156 A1 | 9/2006 | Schechinger | |
| 2006/0282492 A1 | 12/2006 | Suaya | |
| 2007/0271539 A1* | 11/2007 | Murray | G06F 30/392 |
| | | | 716/122 |
| 2008/0172638 A1 | 7/2008 | Gray et al. | |
| 2008/0276212 A1* | 11/2008 | Albrecht | G06F 30/327 |
| | | | 716/122 |
| 2009/0005926 A1 | 1/2009 | Kaubisch | |
| 2009/0199143 A1 | 8/2009 | Schlotman | |
| 2010/0306729 A1 | 12/2010 | Ginetti | |
| 2011/0016423 A1 | 1/2011 | Brubaker | |
| 2011/0093829 A1 | 4/2011 | Orita | |
| 2011/0107281 A1 | 5/2011 | Sun | |
| 2011/0191303 A1 | 8/2011 | Kaufman | |
| 2012/0026187 A1* | 2/2012 | Chao | G06F 40/117 |
| | | | 345/619 |
| 2012/0054699 A1 | 3/2012 | Cho et al. | |
| 2013/0187941 A1 | 7/2013 | Noon | |
| 2013/0290834 A1 | 10/2013 | Ginetti | |
| 2014/0177940 A1 | 6/2014 | Nakagaki | |
| 2014/0264738 A1 | 9/2014 | Barry | |
| 2014/0325460 A1 | 10/2014 | Ferguson | |
| 2015/0012895 A1 | 1/2015 | Chen | |
| 2015/0067632 A1 | 3/2015 | Chen | |
| 2015/0269297 A1 | 9/2015 | Tuan | |
| 2015/0339430 A1 | 11/2015 | Nifong et al. | |
| 2015/0363478 A1 | 12/2015 | Haynes | |
| 2017/0124235 A1 | 5/2017 | Ferguson | |
| 2017/0235848 A1 | 8/2017 | Van Dusen | |
| 2017/0249416 A1 | 8/2017 | Sendig | |

OTHER PUBLICATIONS

Non-Final Office Action dated Nov. 30, 2017 for U.S. Appl. No. 15/199,903.
Non-Final Office Action dated Dec. 11, 2017 for U.S. Appl. No. 15/283,089.
Non-Final Office Action dated Mar. 26, 2018 for U.S. Appl. No. 15/283,081.
Notice of Allowance dated Apr. 16, 2018 for U.S. Appl. No. 15/283,089.
Notice of Allowance dated Apr. 23, 2018 for U.S. Appl. No. 15/282,739.
Notice of Allowance dated May 1, 2018 for U.S. Appl. No. 15/282,778.
Final Office Action dated May 30, 2018 for U.S. Appl. No. 15/199,903.
NA9109385, "Design Extensions to Contents View", IBM Technical Disclosure Bulletin, Sep. 1991, vol. 34, No. 4A, pp. 385-388 (4 pages).
Non-Final Office Action dated Jun. 15, 2018 for U.S. Appl. No. 15/283,042.
Notice of Allowance dated Sep. 11, 2018 for U.S. Appl. No. 15/283,081.
Notice of Allowance dated Oct. 31, 2018 for U.S. Appl. No. 15/283,042.
Non-Final Office Action dated Sep. 10, 2018 for U.S. Appl. No. 15/283,052.
Notice of Allowance dated Dec. 28, 2018 for U.S. Appl. No. 15/283,052.

* cited by examiner

METHODS, SYSTEMS, AND COMPUTER PROGRAM PRODUCT FOR IMPLEMENTING LEGAL ROUTING TRACKS ACROSS VIRTUAL HIERARCHIES AND LEGAL PLACEMENT PATTERNS

CROSS REFERENCE TO RELATED U.S. PATENT APPLICATIONS

This Application is a divisional of U.S. patent application Ser. No. 15/283,052 entitled "METHODS, SYSTEMS, AND COMPUTER PROGRAM PRODUCT FOR IMPLEMENTING LEGAL ROUTING TRACKS ACROSS VIRTUAL HIERARCHIES AND LEGAL PLACEMENT PATTERNS" and filed on Sep. 30, 2016, now U.S. Pat. No. 10,282,505. The contents of the aforementioned U.S. patent application are hereby expressly incorporated by reference for all purposes.

This Application is related to U.S. Patent Application Ser. No. 15/199,903, now U.S. Pat. No. 10,354,037, entitled "METHODS, SYSTEMS, AND COMPUTER PROGRAM PRODUCT FOR IMPLEMENTING AN ELECTRONIC DESIGN BY MANIPULATING A HIERARCHICAL STRUCTURE OF THE ELECTRONIC DESIGN" and filed on Jun. 30, 2016, U.S. patent application Ser. No. 15/282,739, now U.S. Pat. No. 10,055,528, entitled "METHODS, SYSTEMS, AND COMPUTER PROGRAM PRODUCT FOR IMPLEMENTING ENGINEERING CHANGE ORDERS WITH FIGURE GROUPS AND VIRTUAL HIERARCHIES", U.S. patent application Ser. No. 15/282,778, now Pat. No. 10,073,942, entitled "METHODS, SYSTEMS, AND COMPUTER PROGRAM PRODUCT FOR IMPLEMENTING SYNCHRONOUS CLONES FOR AN ELECTRONIC DESIGN", U.S. patent application Ser. No. 15/283,089, now U.S. Pat. No. 10,055,529, entitled "METHODS, SYSTEMS, AND COMPUTER PROGRAM PRODUCT FOR IMPLEMENTING A FLOORPLAN WITH VIRTUAL HIERARCHIES AND FIGURE GROUPS FOR AN ELECTRONIC DESIGN", U.S. patent application Ser. No. 15/283,042 now U.S. Pat. No. 10,210,299, entitled "METHODS, SYSTEMS, AND COMPUTER PROGRAM PRODUCT FOR DYNAMICALLY ABSTRACTING VIRTUAL HIERARCHIES FOR AN ELECTRONIC DESIGN", and U.S. patent application Ser. No. 15/283,081, now U.S. Pat. No. 10,192,020, entitled "METHODS, SYSTEMS, AND COMPUTER PROGRAM PRODUCT FOR IMPLEMENTING DYNAMIC MANEUVERS WITHIN VIRTUAL HIERARCHIES OF AN ELECTRONIC DESIGN". The contents of the aforementioned U.S. patent applications are hereby expressly incorporated by reference for all purposes.

BACKGROUND

Modern electronic designs often include various cells such as some off-the-shelf configurable or non-configurable library cells, intellectual property (IP) cells, macro cells, etc. Each of these cells may be instantiated multiple times as instances in an electronic design so that when a designer desires or requires to make a change to this cell, the designer only needs to make the change once, and all the change will be automatically reflected in all the instances in the electronic design to save development efforts and to expedite the design cycles so as to shorten the time-to-market of the eventual products.

Conventional electronic design implementations include a top-down and a bottom-up approach. A top-down approach begins the implementation process at the top or highest hierarchy and proceeds to lower hierarchies until it reaches the lowest hierarchy to complete an IC design. With the top-down approach, the functional cells at a higher hierarchy may be brought into the layout canvas while each cell include its own pins, ports, or terminals (collectively pin for singular or pins for plural hereinafter). The details of these functional cells at lower hierarchies are not yet exposed and will be designed at respective lower hierarchies as the top-down approach migrates to lower hierarchies. As a result of the non-exposure or unavailability of lower hierarchies (e.g., the lower hierarchies have not yet been implemented), a circuit designer working on a higher hierarchy may need to estimate the size of each cell and guess or guesstimate the locations of pins or terminals for the cell. The estimated cell may be too big to waste invaluable space on silicon or may be too small to accommodate all the devices therein.

In addition to the manual efforts to create the location, identification, etc. for a pin of a cell, these guesstimated pin or terminal locations unlikely to be optimal for connecting with the pins or ports of the devices within the cell. Either way, multiple iterations may be required for even a single cell. In addition, even if the circuit designer knows how these pins are connected to each other, the circuit designer may only align or offset these pins by manipulating the cell. In the event that a designer groups a set of components or cells and intends to create a logical cell for the set, the pins of the logical cell or their identifications thereof (e.g., names of the pins) have to be manually created. The designer will then have to find the corresponding pin identifications in the schematic design and associated these manually created identifications with the corresponding pin identifications.

Bottom-up approaches begin with the design of discrete circuit components and proceed to higher hierarchies as the designs of lower hierarchies are complete until the design for the top or highest hierarchy is complete. In these bottom-up approaches, pins and their identifications as well as locations are determined at lower hierarchies in their respective cells. At the higher hierarchies, these pins often present a challenge to routing these pins of an actual or virtual cell because these pins are determined individually for each cell and independent of each other and may thus cause misalignment of pins or terminals at higher hierarchies where these cells are assembled and supposed to be interconnected. To rectify these problems such as pin or terminal misalignment at higher hierarchies, the design process must return to the lower hierarchies where the devices with the misaligned pins are placed, adjust the placement of the devices, and determine whether the pins or terminals are aligned at the next higher hierarchy. These conventional approaches must then proceed to the next higher hierarchy to determine whether there exist other misalignment problems. These conventional approaches may thus iterate multiple times until an acceptable or desirable solution is found. Therefore, there is a need for a better approach to manipulate the hierarchies of an electronic design to effectively and efficiently create a cell for a group of devices.

The problem is exacerbated during the prototyping, floorplanning, placement stage or during the implementation of a portion of an electronic design where no existing IP cells or blocks are available. For example, a designer may be implementing a portion of the design corresponding to a new design for which no existing cells or blocks are available. As another example, a designer may then need to lay out this portion by placing individual components. The design may then need to create one or more cells or blocks for these newly inserted layout components either because of a design requirement or because of a desire or need for reducing the complexity in the appearance of the layout. In these embodiments, the designer may first place a plurality of layout components in a layout and attempt to create one or more cells for the plurality of layout components.

Moreover, many of these layout components may need to be moved or modified to fit various design requirements during these stages. Some conventional approaches group the selected layout components into a cell but do not add any connectivity to such a cell. For example, a cell created by these conventional approaches may have no ports, pins, or terminals to connect to the remaining portion of the electronic design to which this newly created cell belongs. Some conventional approaches attempt to rectify this shortcoming by requiring manual creation of the boundary as well as manual determination of various connections (e.g., pins, terminals, ports, etc.) along the manually created boundary. These conventional approaches invariably involve some guesstimates and hence a number of iterations to finally create the cell with usable connections along the boundary of the cell.

Modern electronic designs may allow only a fixed number of wire widths. For example, modern electronic designs may include only wires of the following width values—32-nm, 34-nm, 38-nm, 40-nm, 46-nm, 58-nm, 62-nm, 70-nm, 76-nm, 78-nm, and 80-nm. Moreover, the arrangements of wires are also limited by additional design rules imposed by foundries. For example, foundries may require that a 32-nm wire may only be located immediately adjacent to wires of width values smaller than or equal to 46-nm. That is, a 32-nm wire may not be located immediately adjacent to wires having width values of 58-nm, 62-nm, 70-nm, 76-nm, 78-nm, and 80-nm. Such rules impose perplexing complexities in physical implementations (e.g., floorplanning, placement, routing, etc.) of electronic designs. To further exacerbate the complexities, modern electronic designs may permit only a certain number of device patterns. For example, modern electronic designs may permit a first legal device pattern of PMOS-NMOS-NMOS-PMOS and a second legal device pattern of NMOS-PMOS-PMOS-NMOS in the orientation orthogonal to the direction in which the placement rows lie, but not other combinations such as PMOS-PMOS-NMOS-NMOS, NMOS-NMOS-PMOS-PMOS, etc. where PMOS denotes a p-type metal-oxide-semiconductor transistor, and NMOS denotes a n-type metal-oxide-semiconductor transistor. These complexities may cause further issues when an electronic design is partitioned into smaller portions, each of which is then handed off to different designers or design teams for implementation.

To address some of the aforementioned issues, some conventional approaches use brute force techniques that often require time-consuming and resource-wasting iterative techniques to gradually weed out the inconsistencies in routing track assignments and illegal device patterns.

Therefore, there exists a need for methods, systems, and computer program products for implementing legal routing tracks across virtual hierarchies and legal placement patterns.

SUMMARY

Disclosed are method(s), system(s), and article(s) of manufacture for implementing legal routing tracks across virtual hierarchies and legal placement patterns in one or more embodiments. Some embodiments are directed at a method for implementing legal routing tracks across virtual hierarchies and legal placement patterns.

In some embodiments, these techniques identify at least a layout or a portion thereof and determine one or more legal sets of routing tracks for the layout or the portion thereof. These techniques identify or generate one or more figure groups at a first virtual hierarchy, and the one or more first figure groups inherit respective portions of the one or more legal sets of routing tracks.

In alternative embodiments, other techniques identify a plurality of legal devices in a layout or a portion thereof and generate a figure group at least by determining a boundary for the figure group and enclosing the plurality of layout devices within the boundary. These other techniques may modify a placement row in the legal device without disturbing compliance of one or more design rules with which the legal device pattern complies when generated.

Some embodiments are directed at a hardware system that may be invoked to perform any of the methods, processes, or sub-processes disclosed herein. The hardware system may include at least one processor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Overview section below.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1A:
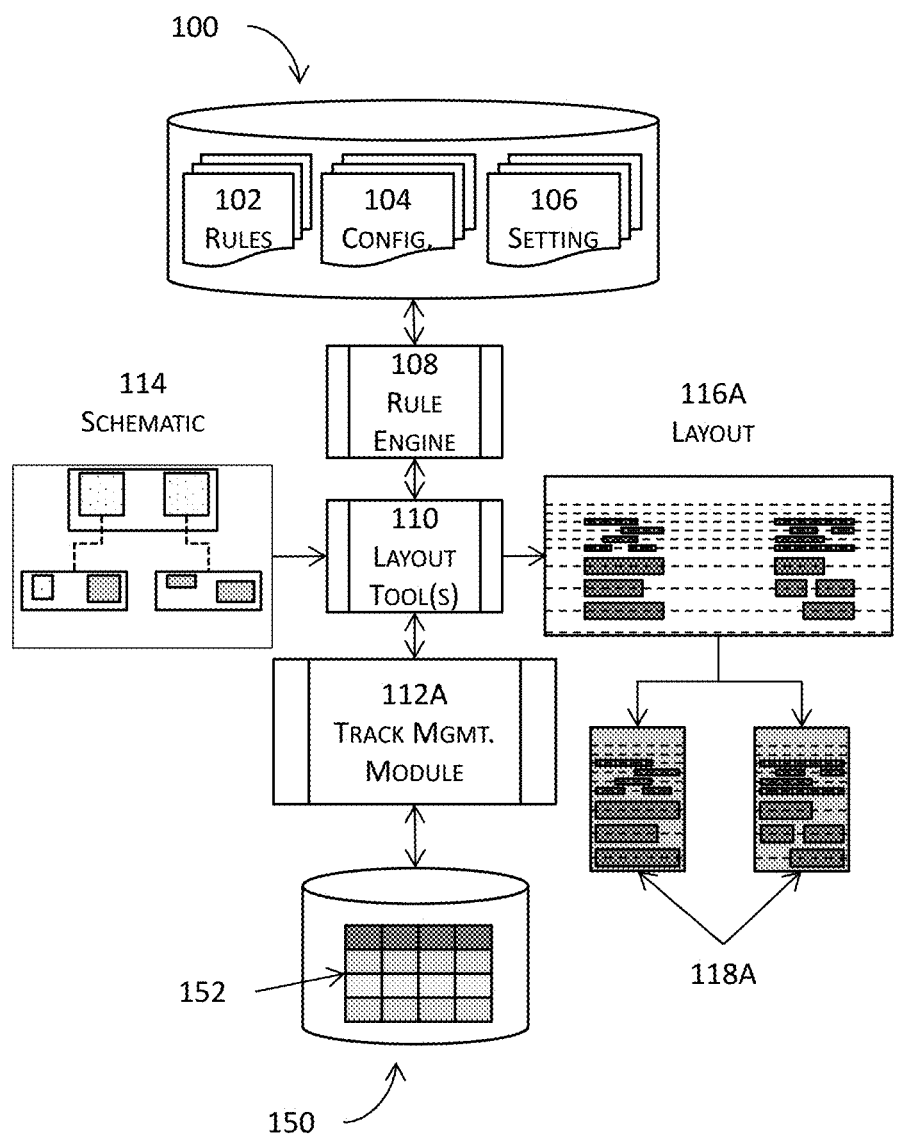
FIGS. 1A-1B illustrate high level block diagrams of simplified systems for implementing legal routing tracks across virtual hierarchies and legal placement patterns in one or more embodiments.

Various techniques are directed to implementing legal routing tracks across virtual hierarchies and legal placement patterns in various embodiments. In some embodiments, a layout or a portion thereof may be identified. This layout or layout portion may include a flat layout or a flat layout portion having a single physical hierarchy and may or may not have been populated with layout shapes. One or more legal track patterns satisfying a set of design rules governing legality of track patterns may be assigned to the layout or the portion thereof. Figure groups may then be identified, if already existing, from the layout or may be created if figure groups have not been created. This layout or layout portion may then be partitioned into multiple, smaller portions that may be further implemented in a distributed or parallel manner by multiple design teams or EDA (electronic design automation) tools. Each of these multiple, smaller portions inherits at least a part of a legal track pattern of the one or more legal track patterns. With these techniques described herein, all portions of the layout are associated with legal track patterns with no conflict, regardless of how the original layout or the original layout portion is partitioned.

In some other embodiments, a flat layout or a flat layout portion comprising one or more virtual hierarchies may be identified. A placement engine may be optionally invoked to place a plurality of layout circuit component designs occupying multiple placement rows in the flat layout or the flat layout portion so that the locations of the plurality of layout circuit component designs satisfy design rules governing placement as well as device pattern legality. A figure group may be created at a virtual hierarchy for the plurality of layout circuit component designs. This figure group or a synchronous clone therefor may be inserted at other locations in the layout or layout portion. In addition, any placement row in the figure group may be manipulated in any manner while the legal device pattern remains DRC clean as long as the rules governing the layout circuit component designs in the row are observed.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

FIG. 1A illustrates a high-level block diagram of a simplified system for implementing legal routing tracks across virtual hierarchies and legal placement patterns in one or more embodiments. In these embodiments, one or more layout tools 110 (e.g., a layout editor) may be coupled with a routing track management engine 112A. These one or more layout tools 110 may be further coupled to a rule engine 108 that accesses a set of rules 102, a set of configurations 104, and/or a set of settings 106 stored in a persistent or transient non-transitory computer readable storage medium 100 to determine one or more legal track patterns and to assign the one or more legal track patterns to a layout or a portion of a layout based in part or in whole upon the applications of the set of rules, configurations, and/or settings. It shall be noted that a layout may include multiple portions while each portion may be assigned a legal track pattern independent of and separate from the other portions.

In operation, the one or more layout tools 110 may reference a schematic design 114 of an electronic design (e.g., an IC design), identify schematic master cells or instances thereof from the schematic design 114, invoke the rule engine 108 to apply a set of rules (102), configurations (104), and/or settings (106), and invoke the routing track management engine 112A to determine one or more legal track patterns and to assign the one or more legal track patterns to the layout 116A. The one or more layout tools 110 may also implement the layout 116A by populating shapes into the layout 116A and partition the layout 116A into multiple portions 118A that may be distributed to multiple EDA tools or design teams for further implementation.

For example, a plurality of figure groups may be created in the layout, and each figure group may be distributed to an EDA tool or a design team to continue the implementation for the distributed figure group. Information about the clones in the layout 116A, their corresponding schematic master cells or instances thereof in the schematic design 114, information about the partitioning, information about the one or more legal track patterns, and other pertinent information may then be maintained at a data structure 152 on a persistent or transient non-transitory computer readable storage medium 150.

Figure 1B:
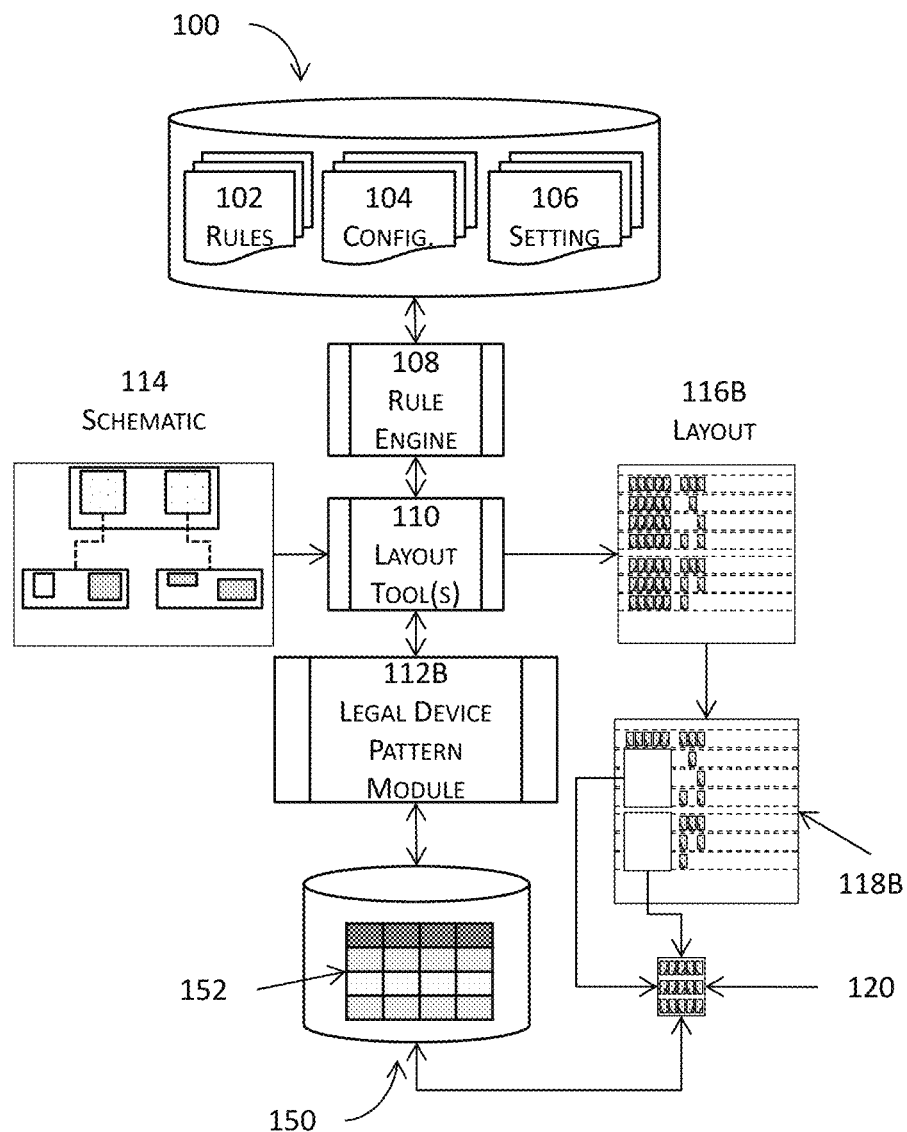

FIG. 1B illustrates another high-level block diagram of a simplified system for implementing legal routing tracks across virtual hierarchies and legal placement patterns in one or more embodiments. FIG. 1B is substantially similar to FIG. 1A, but the one or more layout tools 110 (e.g., a layout editor) may be coupled with a legal device pattern module 112B that functions in tandem with the rule engine 108 and the one or more layout tools 110 to determine, create, and manipulate legal device patterns.

In operation, the one or more layout tools 110 may reference a schematic design 114 of an electronic design (e.g., an IC design), identify schematic master cells or instances thereof from the schematic design 114, invoke the rule engine 108 to apply a set of rules (102), configurations (104), and/or settings (106), and invoke the legal device pattern module 112B to determine whether some patterns in the layout 116B may be converted into legal device patterns (120) and to create and manipulate legal device patterns (120) as shown in the modified layout 118B when the determination result is affirmative. Similarly, information about the legal device patterns in the layout 116B, their corresponding schematic master cells or instances thereof in the schematic design 114, and other pertinent information may then be maintained at a data structure 152 on a persistent or transient non-transitory computer readable storage medium 150.

Figure 2A:
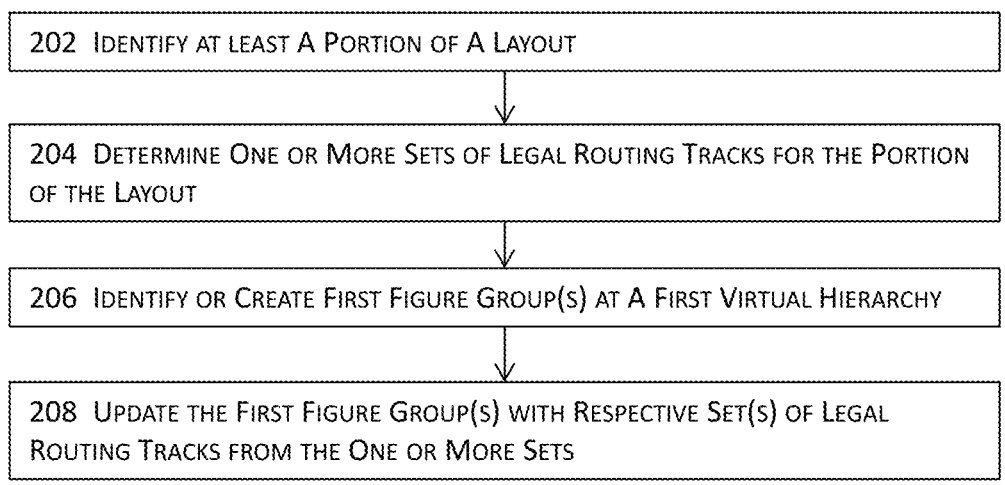
FIGS. 2A-2B illustrate high level block diagrams for implementing legal routing tracks across virtual hierarchies and legal placement patterns in one or more embodiments.
Figure 2B:
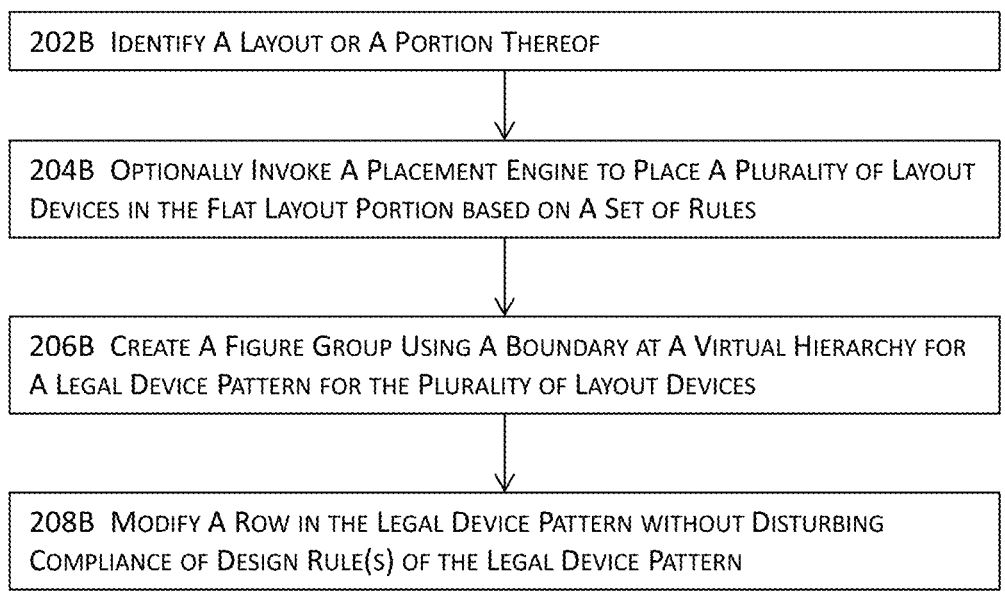

FIGS. 2A-2B illustrate high level block diagrams for implementing legal routing tracks across virtual hierarchies and legal placement patterns in one or more embodiments. More specifically, FIG. 2A illustrates implementing legal routing tracks across virtual hierarchies for an electronic design in one or more embodiments. In these embodiments, at least a portion of a layout may be identified at 202. The layout may be flat (hierarchical having only one hierarchical level) or hierarchical having more than one physical hierarchical levels. In some embodiments, these techniques described herein maintain the layout flat until or unless it is required or desired to have more than one physical hierarchy in the layout. Maintaining the layout as a flat layout avoids the expensive network inputs/outputs to check out and check in layout instances from the hierarchical layout database.

One or more sets of legal routing tracks may be determined at 204 for the portion of the layout. In some embodiments where the portion of the layout has already been populated with shapes, these one or more sets of legal routing tracks may be determined by considering at least some of the shapes so that the width requirements and permissible arrangement requirements of routing tracks are satisfied.

It shall be noted that a routing track is usually selected from the manufacturing grids provided by foundries and thus constitutes a fictitious line or line segment having zero width or thickness. A routing track may nevertheless be associated with a width value so that only shapes or wires having the width value may be implemented along the routing track. A track pattern includes a collection of one or more tracks running in parallel and arranged in a certain sequence or order. Certain design rules may regulate which tracks associated with certain widths may be situated immediately adjacent to another track associated with a width. Therefore, a track pattern is considered legal if the tracks in the track pattern are arranged in an order that fully complies with the design rules governing legality of track arrangement.

The one or more legal track patterns may be assigned to the entire portion of the layout in some embodiments. In some other embodiments, the portion may be subdivided into smaller regions, each of which may be assigned to at least one legal track patterns. If the portion or any subdivided region thereof already contains existing layout shapes, these existing layout shapes control which legal track patterns may be assigned to the portion or region so that the existing layout shapes are consistent with the legal track pattern requirements. More details about legal track patterns are described in U.S. patent application Ser. Nos. 14/231, 688, 14/292,122 (now U.S. Pat. No. 9,372,955), and Ser. No. 14/292,166 (now U.S. Pat. No. 9,396,301), the contents of which are expressly incorporated by reference for all purposes.

One or more first figure group or virtual block (collectively figure group for singular or figure groups for plural) may be identified at 206 for a plurality of layout circuit component designs occupying a plurality of placement rows in the portion of the layout if the one or more first figure groups already exist in the portion. If the one or more first figure groups do not yet exist in the layout, these one or more first figure groups may be created at 206 for the plurality of layout circuit component designs. With the creation of a figure group, a virtual hierarchy is automatically created in the layout. More details about virtual hierarchies are described in the U.S. patent applications listed in the Cross Reference to Related U.S. Patent Applications Section above.

The legal track pattern that is assigned to the region in the portion of the layout now occupied by a first figure group will be passed down to the first figure group. As a result, the one or more first figure groups may be updated at 208 with their respective one or more legal track patterns or one or more sets of legal routing tracks inherited from the one or more legal track patterns determined at 204. The portion of the layout may then be partitioned into multiple, smaller portions that may be further distributed for further implementation. One of the advantages of these techniques described herein is that there will be no conflict in the track patterns between any two portions of the same layout during independent development of these two portions as conventional approaches do.

FIG. 2B illustrates a high-level block diagram for implementing legal placement patterns in one or more embodiments. In these embodiments, a layout or a portion thereof may be identified at 202B. The layout or the portion thereof may be a flat layout or a hierarchical layout having more than one physical hierarchies. A flat layout may be deemed as a hierarchical layout albeit having only one physical hierarchy. A placement engine may be optionally invoked at 204B to place a plurality of layout component designs in a plurality of placement rows in the layout or the portion. The invocation of the placement engine is to ensure that the layout circuit component designs satisfy at least the placement design rules although these techniques apply with full and equal effects to embodiments where device patterns may nevertheless be generated despite not all placement design rules are satisfied by the layout circuit component designs in the device patterns.

A figure group may be created at 206B for a plurality of layout circuit components by using a boundary that encloses the plurality of layout circuit components. With the creation of the figure group for the plurality of layout circuit components, a virtual hierarchy is also created in the layout or the portion although the creation of the virtual hierarchy does not alter the hierarchical structure of physical hierarchies in the layout. Therefore, if the layout or the portion is a flat (with only one physical hierarchy), the creation of the figure group and hence the figure group does not alter the flat structure of the layout, and the layout thus remains flat despite the creation of the virtual hierarchy at which the figure group is located. This figure group represents a legal device pattern when the arrangement of the layout circuit component designs in the placement rows satisfies pertinent design rules governing permissible arrangements of layout devices in adjacent placement rows. A legal device pattern may thus be created by identifying a legal arrangement of layout circuit component designs in the row direction and/or in the column direction based at least in part upon legal device pattern rules and further by creating a figure group for the legal arrangement of layout circuit component designs.

A legal device pattern may be first created as a figure group located at a virtual hierarchy. This legal device pattern logically or virtually represents a hierarchical cell or block and may be operated in exactly the same manner as a physical hierarchical cell or block although the physical hierarchical structure remains unchanged with or without this figure group. This legal device pattern in the form of a figure group may be materialized or detached (collectively materialized) into a physical cell or block. Once a figure group located at a virtual hierarchy is materialized, the virtual hierarchy is also materialized into a physical hierarchy and thus alters the physical hierarchical structure of the layout. Materializing a figure group into a materialized physical cell or block (and hence materialization of a virtual hierarchy) is described in greater details in U.S. patent application Ser. No. 15/199,903, now U.S. Pat. No. 10,354,037, entitled "METHODS, SYSTEMS, AND COMPUTER PROGRAM PRODUCT FOR IMPLEMENTING AN ELECTRONIC DESIGN BY MANIPULATING A HIERARCHICAL STRUCTURE OF THE ELECTRONIC DESIGN" and filed on Jun. 30, 2016, the entire contents of which are hereby expressly incorporated by reference for all purposes.

The layout circuit component designs in any placement row within the figure group may then be modified at 208B as long as the spatial relationship among the layout circuit component designs in the placement row is observed. For example, if a placement row includes layout circuit component designs A, B, C, and D in that order, a modification may be made to change the spacing between any two immediately neighboring layout circuit component designs as long as the order of the layout circuit component designs is maintained. In some of these embodiments where a modification is made to the layout circuit component designs in a placement row while observing the relationship, one or more remaining rows in the figure group may also be modified accordingly so that one or more design rules governing column-to-column arrangements of layout circuit component designs are observed. As a result, such modifications to layout circuit component designs in a placement row do not disturb the DRC (design rule check) clean status of the legal device pattern.

Figure 3A:
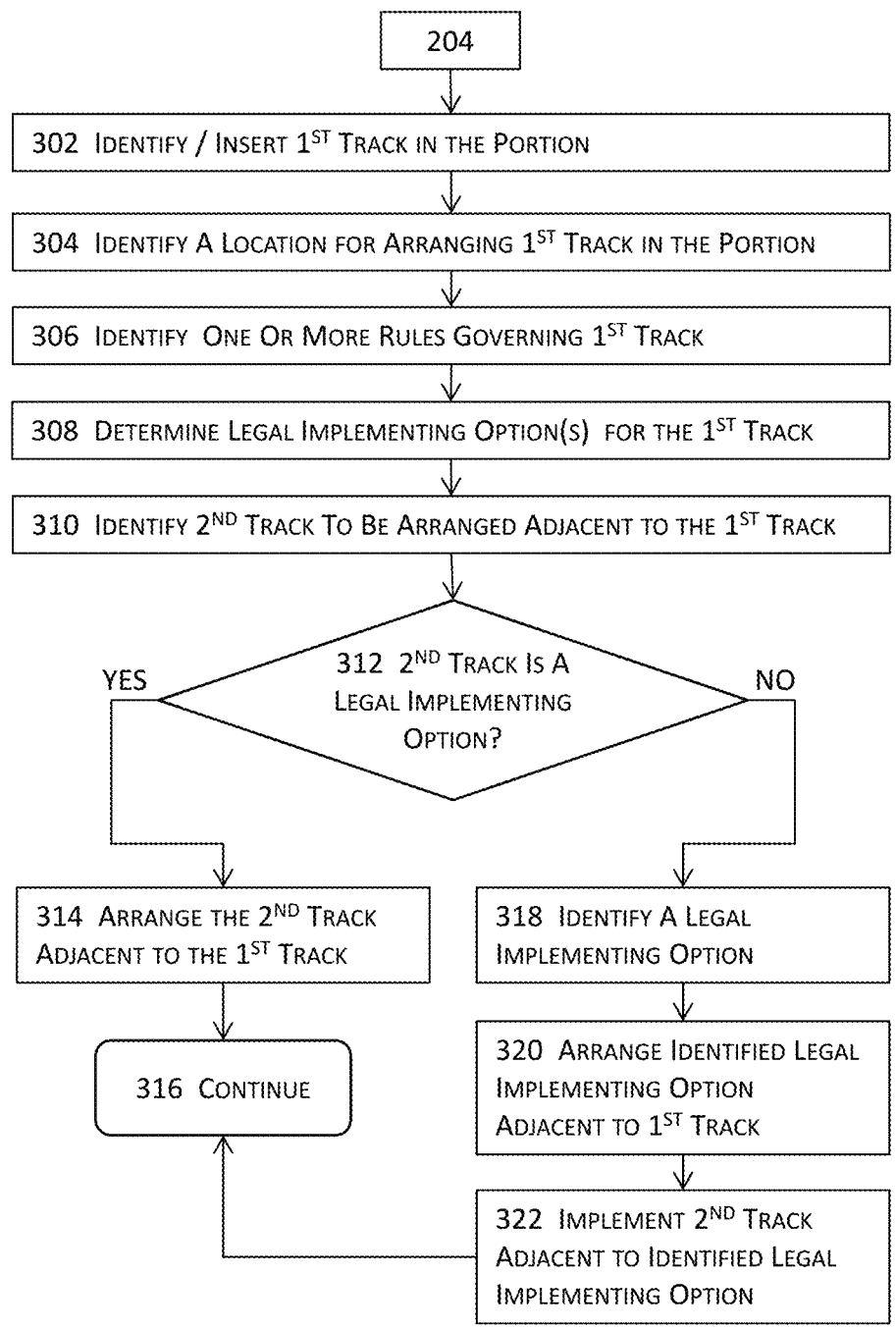
FIG. 3A illustrates a more detailed block diagram for implementing legal routing tracks across virtual hierarchies and legal placement patterns in one or more embodiments.

FIG. 3A illustrates a more detailed block diagram for implementing legal routing tracks across virtual hierarchies and legal placement patterns in one or more embodiments. More specifically, FIG. 3 illustrates more details about determining one or more legal track patterns at 204 illustrated in FIG. 2A. In these embodiments, a first routing track may be identified at 302 in the portion of the layout if the first routing track already exists. If the portion of the layout does not include the first routing track, a first routing track may be created at 302 in the portion of the layout. For example, the first routing track may be selected from the manufacturing grids that are usually spaced at one or a few nanometers from each other in both the horizontal and vertical directions. The first routing track may then be associated with a width value that represents the width of a shape implemented along the first routing track.

A location for arranging the first routing track may be identified at 304 in the portion of the layout. For example, the first routing track may be aligned with a power rail, a power or ground pin, etc. in the portion of the layout. In some embodiments, the width value associated with the first routing track may also be determined at 304 based in part or in whole upon the layout shape that is implemented along the first routing track.

One or more rules governing the first routing track may be identified at 306. These one or more rules are used to determine legal track patterns including the first routing track. In some embodiments, these one or more rules may include, for example, rules governing what the neighboring routing tracks may include, what width values the neighboring routing tracks may be associated with, the spacing values between the routing track and its immediately neighboring routing tracks (one immediately neighboring routing track on each side of the first routing track), etc. As practical examples, these one or more rules may include a minimum spacing design rule governing the minimum spacing between two adjacent routing tracks associated with the same width value or different width values, design rules governing which routing track associated with a first width value may be located immediately adjacent to another routing track associated with a second width value (e.g., pair rules governing which two-width combinations are legal or triplet rule governing which three-width combinations are legal, etc.), one or more other design rules such as a minimum length rule governing the minimum length required for an interconnect segment along a routing track, a same track line-end design rule, a different track line-end design rule, a keep-out design rule, etc.

One or more legal implementation options for the determination of legal track patterns may be determined for the first routing track at 308. In some of these embodiments illustrated in FIG. 3, a viable implementing option may be identified for the first routing track by forward looking into at least a portion of the portion of the layout such that the identified viable implementing option may result in more or the most number of subsequent viable options at 308.

For example, the first routing track identified at 302 may be associated with a 32-nm width value so that layout shapes implemented along the first routing track have the same 32-nm width. If a first legal implementing option adds a second routing track associated with a 46-nm width value, the two-track combination of 32-nm and 46-nm now limits the third routing track to three legal implementation options (e.g., 40-nm, 46-nm, and 58-nm) for the three-track pattern to be legal. On the other hand, if a second legal implementing option adds a second routing track associated with a 38-nm width value, the two-track combination of 32-nm and 38-nm now limits the third routing track to five legal implementation options (e.g., 32-nm, 34-nm, 38-nm, 40-nm, and 46-nm) for the three-track combination to be legal. In this example, these techniques may choose the 46-nm width value for the legal implementation option at 308 for the first routing track so as to have more options to choose from during the identification or determination of routing tracks in a legal track pattern.

A second routing track may then be identified at 310 to be arranged immediately adjacent to the first routing track. Because the second routing track is selected from the legal implementation options for the first routing track, this two-track combination of first routing track—second routing track remains a legal track pattern have two routing tracks at 310.

In some embodiments, the second routing track may not necessarily be selected from legal implementation options of the first routing track. For example, the second routing track may be identified as the routing track aligned with the centerline of an existing shape (e.g., a wire), rather than from the legal implementation options of the first routing track. Therefore, a decision may be made at 312 to determine whether the second routing track is a legal implementation option for the first routing track. If the determination result is affirmative, the second routing track may then be arranged at 314 immediately adjacent to the first routing track to create a legal track pattern having two routing tracks, and the process illustrated in FIG. 3A may continue at 316 to, for example, identify or insert another track in the portion at 302 in some embodiments or proceed to 206.

On the other hand, if the second routing track is determined not to be a legal implementation option for the first routing track at 312, a legal implementation option for the first routing track may be identified at 318, and the legal implementation option includes both the first and second routing tracks. The second routing track and any routing tracks between the first and second routing tracks in the legal implementation option may then be arranged at 320 with respect to the first routing track already added to the portion of the layout. This combination of the existing first routing track and the addition of the second routing track at 322 as well as the addition of any intervening routing tracks at 320 between the first and second routing tracks in the legal implementation option forms a legal track pattern. In other words, although the second routing track identified at 310 does not belong to any legal implementation options, the addition of the intervening routing tracks from a legal implementation option legalizes the combination of routing tracks. The process may then continue to identify the next routing track into the legal track pattern by following an identical or substantially similar approach described above.

Figure 3B:
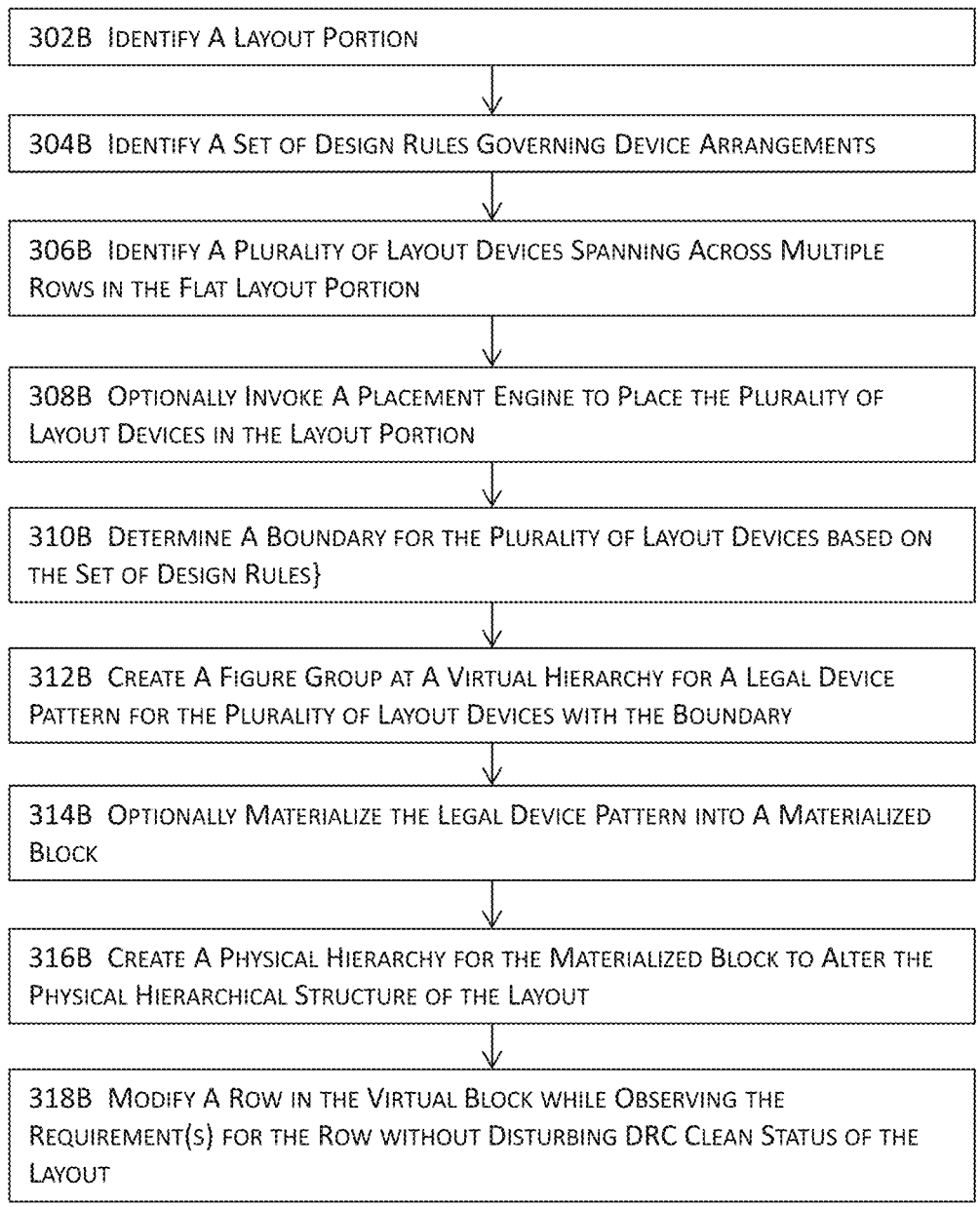
FIG. 3B illustrates a more detailed block diagram for implementing legal placement patterns in one or more embodiments.

FIG. 3B illustrates a more detailed block diagram for implementing legal placement patterns in one or more embodiments. In these embodiments, a layout or a portion thereof may be identified at 302B; and a set of design rules may be identified at 304B. The set of design rules includes, for example, design rules governing permissible orders of one or more types of layout devices in a single placement row or across multiple placement rows, permissible arrangements of one or more types of layout devices in a single placement row or across multiple placement rows, design rules pertaining to functions of one or more types of layout devices in a legal device pattern, etc.

A plurality of layout devices or layout circuit component designs spanning across multiple placement rows may be identified at 306B. It shall be noted that the terms "layout device" and "layout circuit component design" are used interchangeably throughout the entire application. Furthermore, the plurality of layout devices identified at 306B occupy multiple placement rows where each placement row may include one or more layout devices. A placement row is a region in a layout canvas centered along a routing track and occupying space on both sides of the routing track, and the space on both sides of the routing track defines the height of the placement row. Layout devices are thus placed within placement rows in a layout canvas. A placement row may be oriented horizontally or vertically despite the fact that the term "row" usually defines a horizontal region, and the term "column" usually defines a vertical region. In some embodiments, the heights of these multiple placement rows may be identical, whereas the heights of these multiple placement rows may include two or more different height values in some other embodiments.

It shall be noted that the plurality of layout devices may be arranged in these multiple placement rows with or without regard to design rules. For example, a designer may create a plurality of layout devices in multiple placement rows for a quick planning or feasibility estimate without regard to one or more design rules governing the legality of positions of these layout devices. In some embodiments, the physical design modules (e.g., reference numerals 110, 112B, 112A, etc. in FIGS. 1A-1B) may be made aware of the design rules governing various aspects of the placement of layout devices (e.g., order, spacing, arrangement, etc.) These physical design modules may be configurable to enforce none, some, or all of these design rules. For example, these physical design modules may be configured to enforce none of these design rules during the feasibility evaluation, design planning, floorplanning, or other earlier stages of layout implementation.

These physical design modules may be subsequently configured to enforce some of the design rules during more stable design stages that require or desire correct layout. During these earlier stages, feasibility, Silicon utilization, etc. may be more important than, for example, whether all design rules are satisfied, and therefore the physical design modules may be configured to relax one or more design rules to conserve computational resources and to generate the resulting layout in a quicker and more efficient manner due to frequent and perhaps larger scale changes in the layout. When the implementation goal is to finalize the layout (e.g., to produce a placement layout), the physical design modules may be configured to enforce all of the design rules during design stages that work toward finalizing the layout.

A placement engine may be optionally invoked at 308B to place the plurality of layout devices in these multiple placement rows. Invoking a placement engine to place the plurality of layout devices results in an arrangement of the plurality of layout devices that satisfies pertinent placement design rules. The invocation of a placement engine to perform placement for the plurality of layout devices among these multiple placement rows results in a legal device pattern that satisfies all pertinent design rules. Nonetheless, as described above, these techniques also apply with full and equal effects to generate device patterns while one or more design rules of these pertinent design rules may be at least temporarily relaxed. Therefore, the use of the term "legal device pattern" refers to a device pattern comprising a plurality of layout devices that is arranged in a way to satisfy at least one design rule while one or more other design rules may be relaxed and thus not satisfied. For example, a legal device pattern may observe an order in which layout devices are arranged within a placement row or another order in which corresponding layout devices in multiple placement rows are arranged. Nonetheless, this legal device pattern may violate one or more other design rules (e.g., spacing between two immediately adjacent layout devices).

A boundary may be determined at 310B to enclose the plurality of layout devices identified at 304B based in part or in whole upon the set of design rules identified at 306B. The boundary may be created to be the minimum rectilinear polygon enclosing the plurality of layout devices in some embodiments or the minimum rectilinear polygon of the plurality of device designs plus a constant or variable offset to enclose the plurality of layout devices in some other embodiments.

In addition, to provide layout connectivity information, especially when routing details are still absent in the layout, one or more locations of one or more layout pins along the boundary may also be determined for the boundary. In some embodiments where the boundary constitutes the minimal bounding box of the plurality of layout devices enclosed therein, these one or more layout pin locations may be extracted from the corresponding locations of the set of layout components. In some other embodiments where the boundary constitutes the minimal bounding box plus some uniform or non-uniform offset, this determination of the layout pin locations may be determined based in part or in whole upon the information about the corresponding schematic pins and optionally upon the one or more schematic nets.

In some of these latter embodiments, these layout pin locations may be determined as the intersections between the boundary enclosing the plurality of layout devices and the corresponding physical nets, if available. The boundary object may be updated at least by adding the one or more layout pins, ports, or terminals at those determined locations along the boundary. The names or identifications of the layout pins, ports, or terminals may be automatically populated from the corresponding schematic connectivity information in some embodiments.

A figure group at a virtual hierarchy may be created for a legal device pattern at 312B with the boundary enclosing the plurality of layout devices. The creation of a figure group logically and virtually pushes the plurality of layout devices enclosed in the figure group down in the hierarchical structure of the original layout. Therefore, the creation of the figure group at 312B virtually and logically creates a virtual hierarchy for the figure group, if the virtual hierarchy does not yet exist. One of the advantages of these techniques employing virtual hierarchies is that these techniques thus maintain the layout as flat as possible while being enabled to leverage all the advantages of having a hierarchical layout, without altering the physical hierarchical structure of the layout unless or until it is desired or required to do so.

The legal device pattern in the form of a figure group may be optionally materialized or detached at 314B into a physical cell or block. The materialization of a figure group also materializes the virtual hierarchy at which the figure group is originally located. As a result, a physical hierarchy may be created at 316B from the virtual hierarchy if the virtual hierarchy has not been materialized due to the materialization of another figure group or another legal device pattern located at the same virtual hierarchy as the legal device pattern. In some embodiments, one or more other figure groups located at the same virtual hierarchy will also be materialized into one or more corresponding figure groups. In some of these embodiments where synchronous clones have been created, the legal device pattern may be replaced with an instance of a synchronous clone that has already been materialized.

The legal device pattern created at 312B may be modified at 318B without affecting its legality or compliance with design rules with which the legal device pattern complies when it is first created at 312B. For example, any placement row in the figure group may be manipulated in any manner while the legal device pattern remains compliant with the design rule(s) as long as the design rules governing the layout circuit component designs in the placement row are observed. In this example, the layout devices in a placement row within the figure group may be modified at 314B as long as the spatial relationship among the layout devices in the placement row is observed.

Figure 4A:
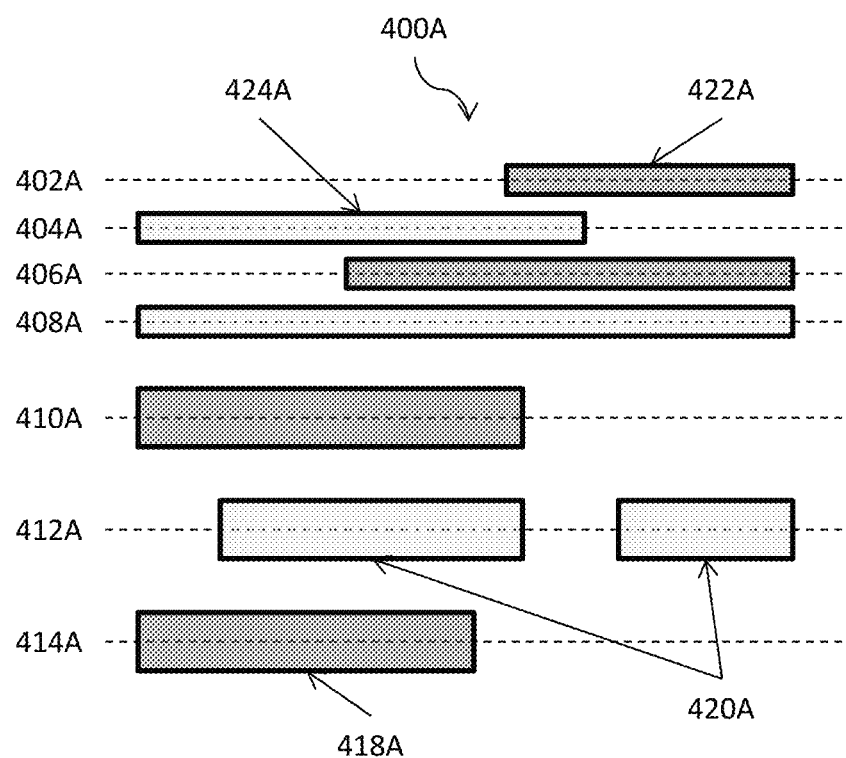
FIGS. 4A-4I illustrate some examples of the application of some techniques for implementing legal routing tracks across virtual hierarchies and legal placement patterns described herein to a simplified portion of an electronic design in some embodiments.

FIGS. 4A-4I illustrate some examples of the application of some techniques for implementing legal routing tracks across virtual hierarchies and legal placement patterns described herein to a simplified portion of an electronic design in some embodiments. FIG. 4A illustrates a legal track pattern including a plurality of routing tracks 402A, 404A, 406A, 408A, 410A, 412A, and 414A. As it can be seen from FIG. 4A, the routing tracks in this legal track pattern 400A are associated with different width values.

Shapes implemented along these routing tracks inherit the width values associated with their respective routing tracks. For example, routing tracks 402A, 404A, 406A, and 408A are associated with a 1X-width value so the shapes 422A and 424A are thus implemented with the same 1X-width value. On the other hand, routing tracks 410A, 412A, and 414A are associated with a 2X-width value so the shapes 420A and 418A are thus implemented with the same 2X-width value. One of the uses of a legal track pattern such as the legal track pattern 400A shown in FIG. 4A is to ease the tasks of coloring shapes or routing tracks for multiple exposure lithography. In this example, the routing tracks may be colored with their respective photomask assignments so that the first set of shapes including shapes 422A and 418A also inherit the color or mask designation, the first photomask in this example, of their corresponding routing tracks. Similarly, the second set of shapes including shapes 424A and 420A also inherit the color or mask designation, the second photomask in this example, of their corresponding routing tracks.

Figure 4B:
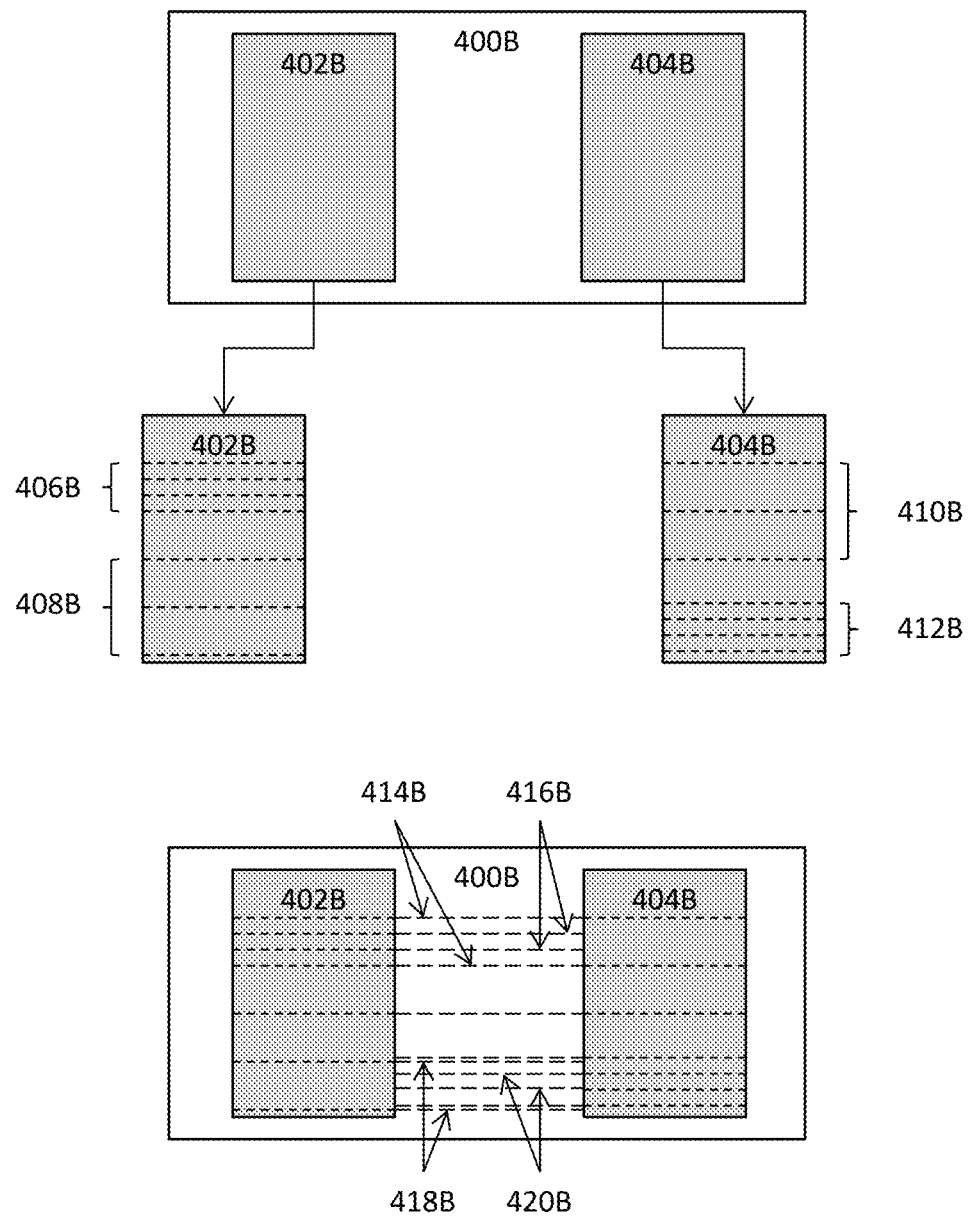

FIG. 4B illustrates separate identifications of track patterns for two blocks of a layout and conflicts between the separately identified track patterns. In this example, a layout 400B includes two blocks 402B and 404B that are distributed to two separate design teams for implementation. The first design team may determine a first track pattern including routing tracks 406B and 408B as illustrated in FIG. 4B; and the second design team may determine a second track pattern including routing tracks 410B and 412B also as illustrated in FIG. 4B. These two design teams may then proceed with their separate implementations for their respective blocks. The issue arises when these two block designs are integrated together into the layout 400B.

As FIG. 4B shows, the implementation of block 402B includes the routing tracks 406B. Nonetheless, unless the layout 400B is partitioned into separate portions (e.g., 402B and 404B) each having its own separate track patterns, these two blocks 402B and 404B cannot have a common track pattern. Moreover, the extension of routing tracks 406B includes two routing tracks 414B and two other routing tracks 416B. Even if routing tracks 414B are aligned with routing tracks 410B, the second track pattern for block 406B does not include any track patterns that correspond to routing tracks 416B. Similarly, the first track pattern for block 402B does not include routing tracks to accommodate routing tacks 420B extended from block 404B. In addition, routing tracks 418B extended from some of the routing tracks 412B are not aligned with the corresponding routing tracks 408B as shown in FIG. 4B. As a result, this design methodology creates additional complexities in the physical implementation of merely two blocks in a layout, not to mention layouts having much more blocks.

Figure 4C:
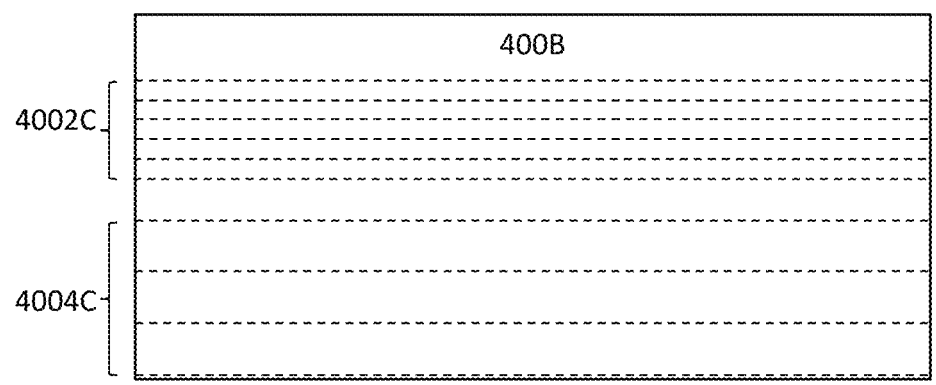
Figure 4D:
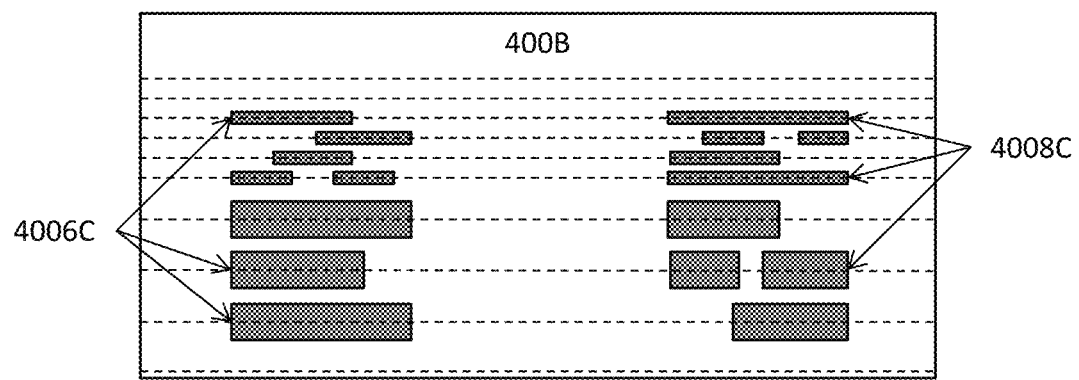

FIG. 4C illustrates an example of an application of some of the techniques described herein in some embodiments. These techniques identify the layout 400B or a portion thereof and examine the shapes, if any, that are already populated into the layout 400B. For example, these techniques may examine the shapes 4006C and 4008C illustrated in FIG. 4D to determine the routing tracks that align with these existing shapes and are associated with the correct width values as indicated by the widths of shapes 4006C and 4008C. These techniques then determine one or more legal track patterns such a legal track pattern including a first set of routing tracks 4002C at a first spacing value and a second set of routing tracks 4004C at a second spacing value.

Figure 4E:
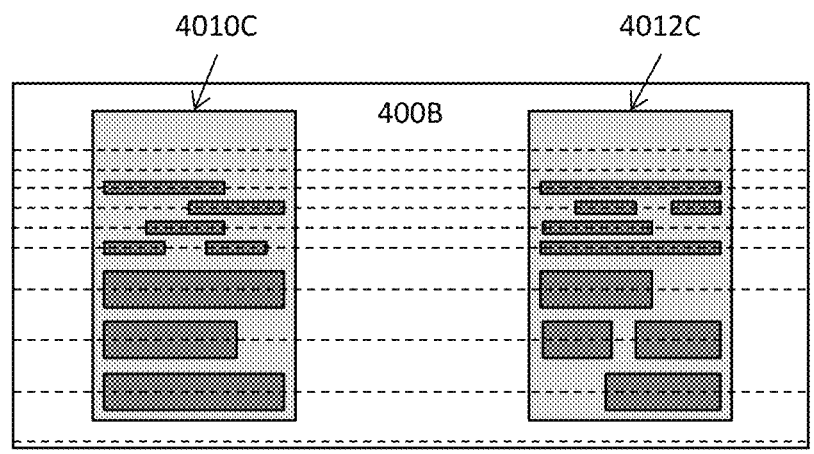

These techniques may then identify blocks 4010C and 4012C in FIG. 4E if these two blocks 4010C and 4012C are already existing in the layout 400B. If these two blocks are not yet existing in the layout 400B, these techniques may then generate two figure groups to respectively enclose the two sets of shapes as illustrated in FIG. 4E. These blocks or figure groups 4010C and 4012C inherit the one or more legal track patterns determined above as illustrated in FIG. 4F.

Figure 4F:
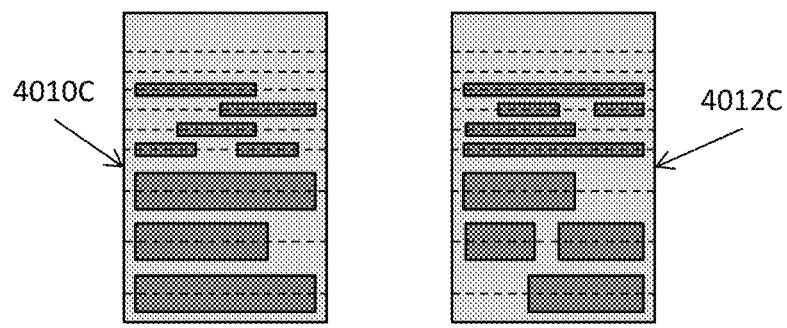

These two blocks or figure groups 4010C and 4012C in FIG. 4F may then be distributed to two separate EDA tool sessions or two design teams to continue their implementations.

Figure 4G:
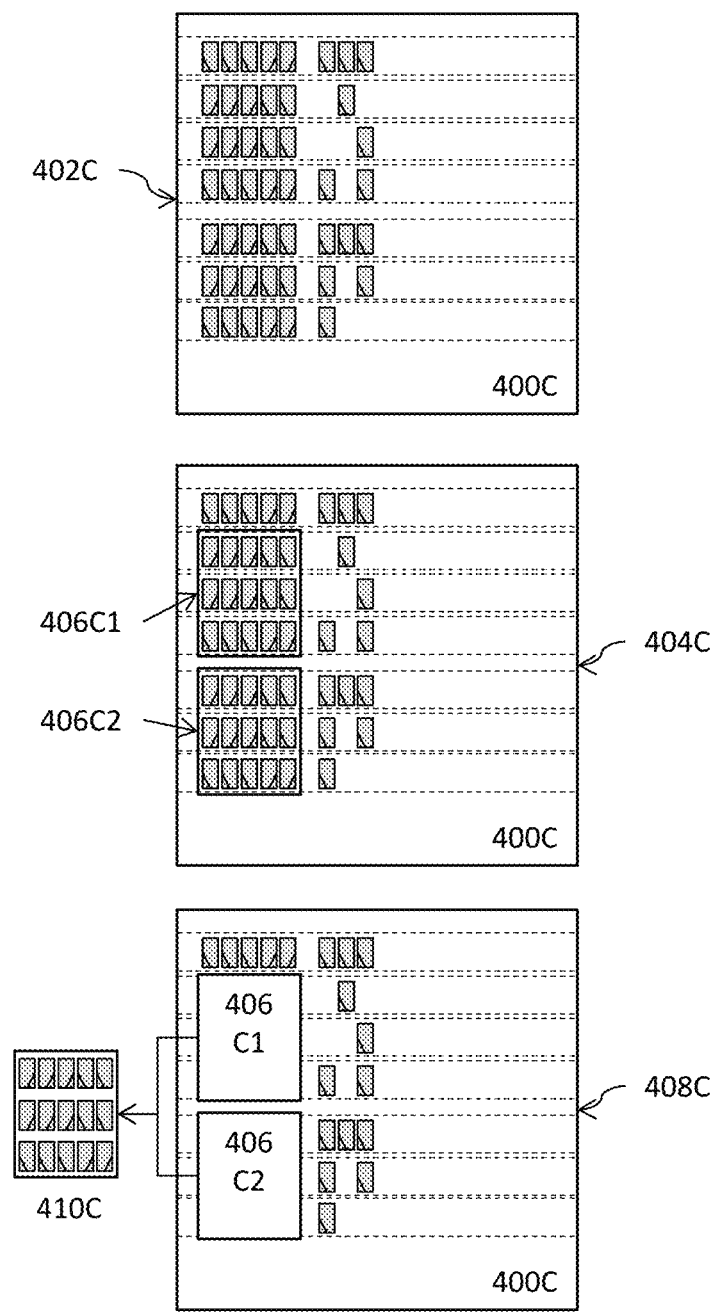

FIG. 4G illustrates a layout canvas 400C including a layout portion 402C that comprises a plurality of layout devices whose arrangements are subject to design rules. For example, the layout may permit only a first legal device pattern of PMOS-NMOS-NMOS-PMOS and a second legal device pattern of NMOS-PMOS-PMOS-NMOS in the orientation orthogonal to the direction in which the placement rows lie, but not other combinations such as PMOS-PMOS-NMOS-NMOS, NMOS-NMOS-PMOS-PMOS, etc. In this example, some of these techniques described herein may create two legal device patterns 406C1 and 406C2 to modify the layout 402C into 404C. In addition, the two legal device patterns 406C1 and 406C2 may be represented as abstract representations in the layout portion 408C, and each of these two abstract representations corresponds to the same figure group or legal device pattern illustrated in 410C.

Figure 4H:
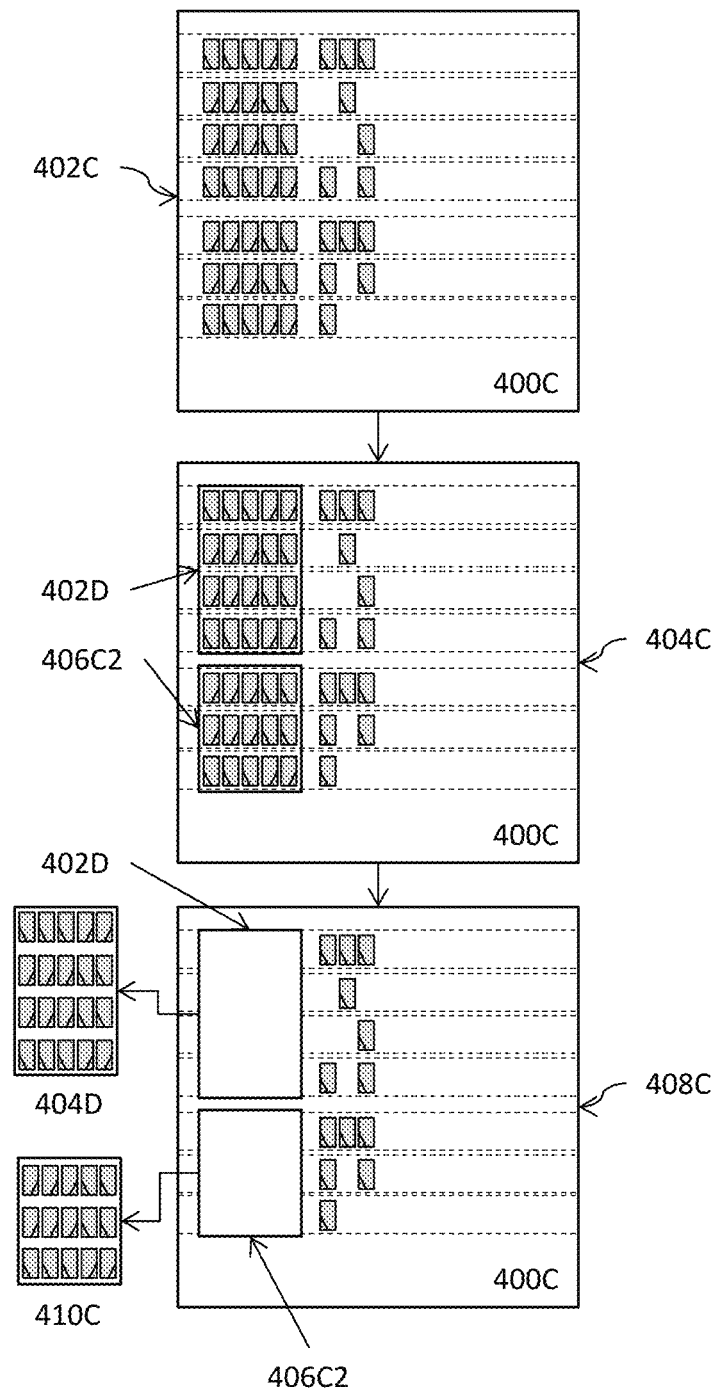

Layout portions 404C and 408C also illustrate an example involving virtual hierarchies. As the legal device patterns 406C1 and 406C2 are created for their respective sets of shapes in the originally flat layout portion 402C, the creation of these two legal device patterns also creates a virtual hierarchy in this example. For example, layout portion 402C is originally a flat layout portion including the plurality of shapes. The creation of two legal device patterns 406C1 and 406C2 effectively places these two legal device patterns 406C1 and 406C2 at the same hierarchy as the remaining layout devices that are not included in these two legal device patterns. As a result, these two legal device patterns 406C1 and 406C2 are not logically located at the same virtual hierarchy with the remaining layout devices not in the legal device patterns, while the layout devices in these two legal device patterns are logically located at another virtual hierarchy below the virtual hierarchy at which the legal device patterns are located. FIG. 4H illustrates another example of generating two legal device patterns 402D and 406C2. The layout portion 408C in FIG. 4H may also include abstract representations of legal device pattern 404D and legal device pattern 410C. FIGS. 4G-H thus illustrate the multitudes of legal device patterns that may be created for the same layout portion 402C by generating different boundaries to enclose different arrangements of layout devices that are permitted by design rules.

Figure 4I:
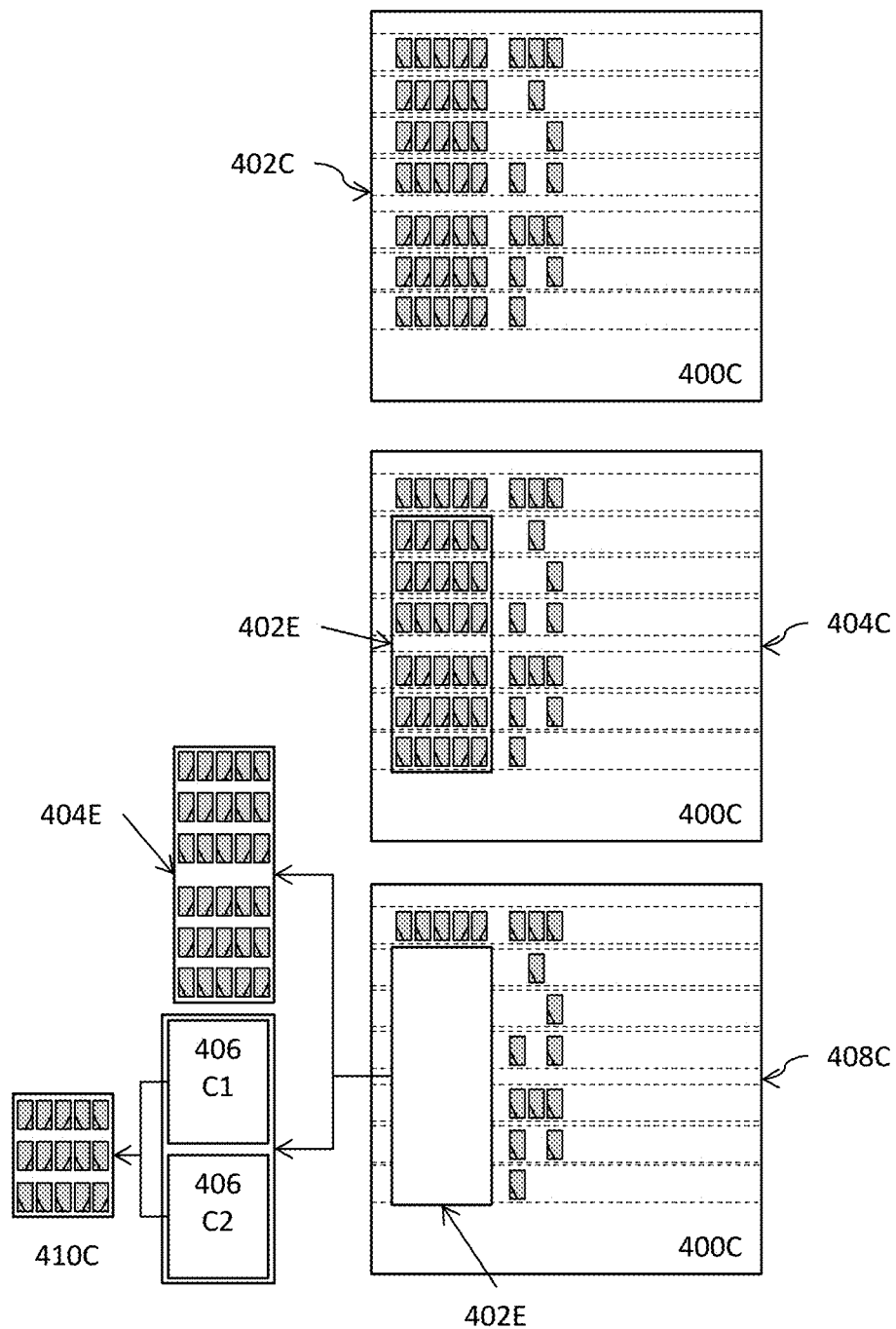

FIG. 4I illustrates another example of generating a legal device pattern 402E from legal device patterns 406C1 and 406C2. The layout portion 408C in FIG. 4H may also include abstract representations of legal device pattern 404D at the first virtual hierarchical level as the other layout devices not included in the legal device pattern 404D. Immediately below the first virtual hierarchy lies the second virtual hierarchy at which legal device patterns 406C1 and 406C2 are located. The third virtual hierarchy immediately below the second virtual hierarchy corresponds to the two sets of layout devices respectively included in legal device patterns 406C1 and 406C2. FIG. 4I thus illustrates that a legal device pattern may be nested in another legal device pattern, and the creation of a legal device pattern within another legal device pattern effectively creates another virtual hierarchy in some embodiments. In these embodiments, the legal device pattern 402E includes two legal device sub-patterns 406C1 and 406C2, each of which is an abstract representation that further corresponds to the device sub-pattern illustrated in 410C. In some other embodiments, the plurality of layout devices may be created in a single legal device pattern 404E that contains no lower virtual or physical hierarchies.

Figure 5:
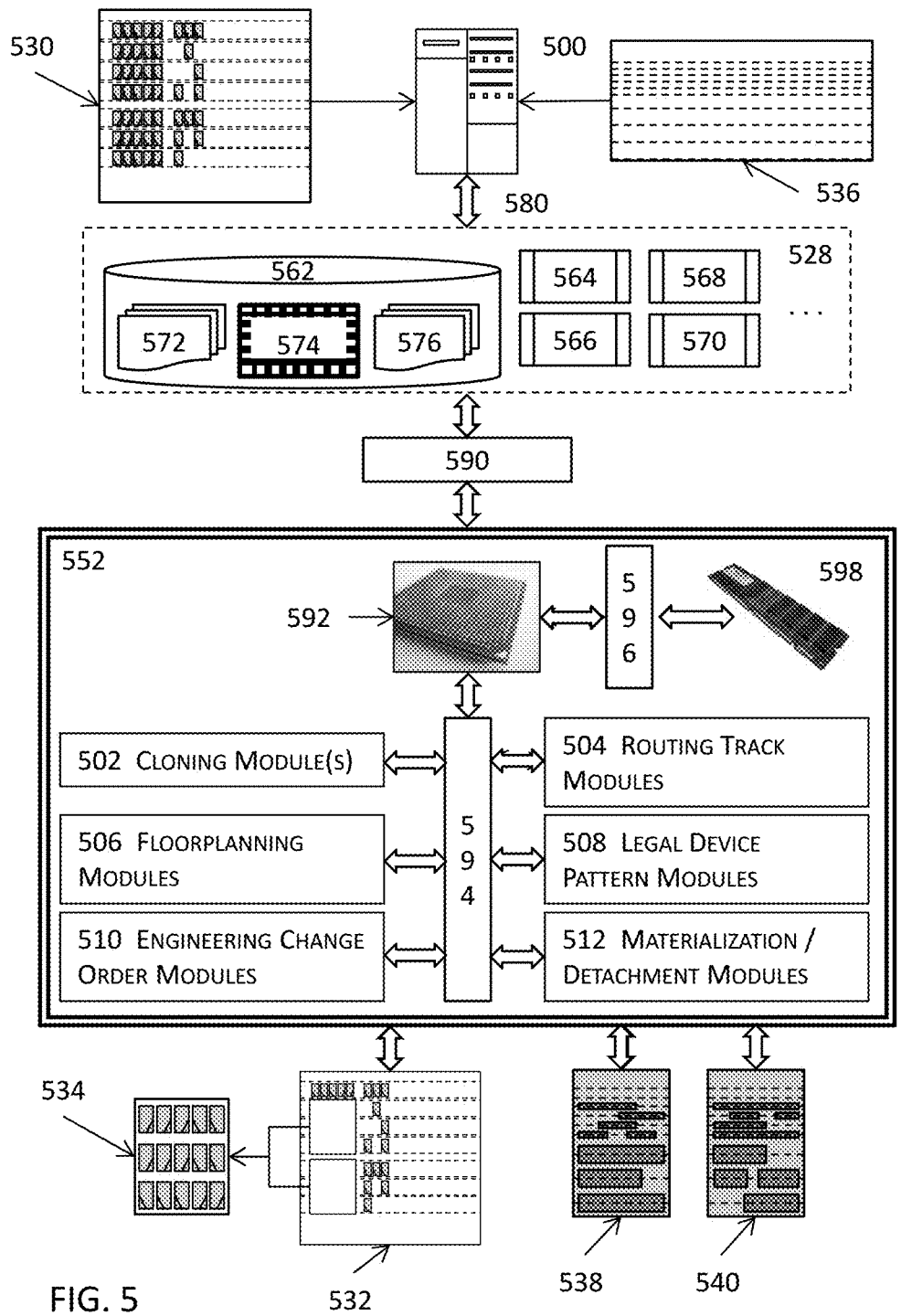
FIG. 5 illustrates another high-level block diagram of a simplified system for implementing legal routing tracks across virtual hierarchies and legal placement patterns in one or more embodiments.

FIG. 5 illustrates a high-level block diagram of a system for implementing legal routing tracks across virtual hierarchies and legal placement patterns in one or more embodiments. In these one or more embodiments, the hardware system in FIG. 5 may comprise one or more computing systems 500, such as one or more general purpose computers described in the System Architecture Overview section to implement one or more special proposes. The illustrative system in FIG. 5 may include an Internet-based computing platform providing a shared pool of configurable computer processing resources (e.g., computer networks, servers, storage, applications, services, etc.) and data to other computers and devices in a ubiquitous, on-demand basis via the Internet. For example, one or more computing resources and/or modules illustrated in FIG. 5 may be located in a cloud computing platform in some embodiments.

In some embodiments, the one or more computing systems 500 may invoke various system resources such as the processor(s) or processor core(s), memory, disks, etc. and receive a layout 536 and determines one or more legal track patterns for the layout 536. These one or more legal track patterns may be inherited by any blocks, cell, figure groups, or legal device patterns (e.g., 538, 540, etc.) in the layout 536 so that these blocks, cell, figure groups, or legal device patterns (e.g., 538, 540, etc.) may be distributed among different EDA tool sessions to continue their implementations. The one or more computing systems 500 may further receive a layout 530 including a plurality of layout devices and create legal device patterns as shown in the modified layout 532. These legal device patterns 534 are located at a virtual hierarchy until materialization of the legal device patterns or the virtual hierarchy itself and may be represented as abstract representation in the modified layout 532.

A cloning module 502 may by itself or in tandem with one or more other modules identify or create clones in the layout 532 that may be optionally materialized into a physical block or cell 534. The one or more computing systems 500 may also initiate or interact with other computing systems to access, via a computer bus architecture (e.g., a system bus, a control bus, a data bus, or any combinations thereof), various resources 528 that may comprise a floorplanner, a placement module, a global routing module, and/or a detail routing module 564, a layout editor 566, a design rule checker 568, a verification engine 570, etc.

The one or more computing systems 500 may further write to and read from a local or remote non-transitory computer accessible storage 562 that stores thereupon data or information such as, but not limited to, one or more databases (574) such as schematic design database(s) or physical design database(s), electronic circuit design specification database(s), various statistics, various data, rule decks, various design rules, constraints, etc. (572), or other information or data (576) that may be used to facilitate the performance of various functions to achieve the intended purposes.

The one or more databases 574 may further include a plurality of cells, blocks, or modules (collectively a cell for singular and cells for plural). Cells may include, for example, one or more standard cells, one or more library cells, one or more memory cells, one or more macro cells, or any combinations thereof. A cell may be an object of a class in the paradigm of object-oriented programming and may thus be instantiated into multiple instances to create at least a portion of a hierarchical physical design (e.g., a floorplan, a layout, etc.) or to create a larger and/or more complex cell in some embodiments. In the real hierarchy structure of a hierarchical physical design, certain cells may be situated at the lowest hierarchical level and do not contain any lower hierarchies.

In some embodiments, the one or more computing systems 500 may include or, either directly or indirectly through the various resources 528, invoke a set of mechanisms or modules 552 including hardware and software modules or combinations of one or more hardware and one or more software modules that are stored at least partially in computer memory may comprises one or more cloning modules 502 to identify and/or create clones. The set of modules 552 may further include one or more routing track modules 504 to manage and determine routing tracks that may be inherited by various figure groups at one or more virtual hierarchies without causing any violations of rules for routing track assignments, routing track coloring, etc.

The set of modules 552 may further optionally include one or more floorplanning modules 506 to perform design planning or floorplanning to create a floorplan. Constraints, design rules, and requirements are collectively referred to as a design rule for singular or design rules for plural. In addition or in the alternative, the set of modules 552 may further include one or more legal device pattern modules 508 to identify and/or create legal device patterns into one or more figure groups so that all the pertinent rules or requirements will be automatically complied with so long as the arrangements in these legal device patters are observed.

In some embodiments, the set of modules 552 may further include one or more engineering change order (ECO) modules 510 to function in tandem with figure groups and virtual hierarchies to implement engineering change orders. The set of modules 552 may also include a detachment or materialization module 512 to materialize a figure group into a physical block and to materialize a virtual hierarchy into a physical hierarchy and update the physical hierarchical structure of a layout accordingly. Any of these modules described may be stored at least partially in memory and include or function in tandem with one or more microprocessors or one or more processor cores to perform respective functions described herein.

The set of modules 552 may further optionally include one or more signoff modules (not shown) to perform various signoff and design closure tasks to ensure that the electronic design implemented by various techniques described herein may be successfully fabricated while maintaining various performance, cost, reliability, and manufacturability requirements.

For example, the one or more signoff modules may include one or more timing signoff modules to perform timing analyses and timing closure related tasks (e.g., silicon-accurate timing signoff, signal integrity analyses, etc.) to ensure an electronic design meets power, performance, or other requirements before tapeout, one or more signoff parasitic extraction modules to provide silicon-accurate interconnect parasitic extraction and ensure first-pass silicon success, and one or more power signoff modules to perform various power integrity analyses, transistor-level electromigration and IR-drop analyses, or other power and signal integrity analyses with SPICE-level accuracy or better accuracy with SPICE or SPICE-like simulations (e.g., Fast-SPICE, HSPICE, PSPICE, or any other SPICE-based or SPICE-compatible simulations) to ensure an electronic design meets or exceeds power, performance, and/or area goals in some embodiments.

The one or more signoff modules may include one or more physical verification modules (not shown) to perform various design rule checking, layout vs. schematic (LVS), etc. tasks to ensure that an electronic design meets or exceeds various spatial and other physical rules and one or more design for manufacturing (DFM) modules to address physical signoff and electrical variability optimization, correct lithography hotspots, predict silicon contours, improve yield, detect and repair timing and leakage hotspots to achieve variation- and manufacturing-aware signoff and design closure in some of these embodiments.

In addition or in the alternative, the one or more signoff modules may include one or more one or more computational lithography modules (not shown) to provide more accurate post-etch critical dimension accuracy and process windows on silicon, reticle and wafer synthesis, etc. to eliminate errors and/or reduce mask-manufacturing cycle times. One or more of these signoff modules may operate on the electronic design produced or modified with various techniques to be described in the following sections for proper signoff and design closure so that the signoff version of the electronic design may be properly manufactured with first-pass or fewer passes silicon success in some embodiments. In these embodiments, the signoff version of the electronic design produced or modified with various techniques described herein causes the underlying electronic circuit to be manufactured by a foundry or IC (integrated circuit) fabrication facility when the signoff version of the electronic design is forwarded to the foundry or IC (integrated circuits) fabrication facility that in turn fabricates the requisite photomasks and the eventual electronic circuit.

In some embodiments, the computing system 500 may include the various resources 528 such that these various resources may be invoked from within the computing system via a computer bus 580 (e.g., a data bus interfacing a microprocessor 592 and the non-transitory computer accessible storage medium 598 or a system bus 590 between a microprocessor 592 and one or more engines in the various resources 528). In some other embodiments, some or all of these various resources may be located remotely from the computing system 500 such that the computing system may access the some or all of these resources via a computer bus 580 and one or more network components.

The computing system may also include one or more modules in the set of modules 552. One or more modules in the set 552 may include or at least function in tandem with a microprocessor 592 via a computer bus 594 in some embodiments. In these embodiments, a single microprocessor 592 may be included in and thus shared among more than one module even when the computing system 500 includes only one microprocessor 592. A microprocessor 592 may further access some non-transitory memory 598 (e.g., random access memory or RAM) via a system bus 596 to read and/or write data during the microprocessor's execution of processes.

In various embodiments, one or more legal and hence permissible track patterns may be identified at a higher hierarchy of a layout. When this layout at the higher hierarchy is subdivided into multiple smaller portions, these one or more track patterns will be automatically passed to the corresponding portions of the subdivision. In this manner, when a first designer implements a first portion and a second designer implements a second portion, both designers use the legal track patterns to implement their respective portions. Because these one or more track patterns are determined at the higher hierarchy including both the first and second portions, any synchronous clones in both portions will be implemented with the same one or more legal track patterns because these one or more legal track patterns are created at the higher hierarchy having visibility of these synchronous clones in both portions. In some embodiments, these one or more legal track patterns may be determined on a flat layout including cells or blocks and discrete device designs but not any internal details of these cells or blocks, and these one or more legal track patterns may be subsequently passed to implementations of these cells or blocks at lower hierarchies.

A track pattern includes a collection of one or more routing tracks or simply tracks running in parallel and arranged in a certain sequence or order. Certain design rules may regulate which routing tracks associated with certain width values may be situated immediately adjacent to another track associated with a width. For example, a design rule may require that only tracks associated with a width greater than or equal to 58-nm may be situated immediately adjacent to another track associated with 46-nm width. Therefore, a track pattern is considered legal if the tracks in the track pattern are arranged in an order that fully complies with the design rules governing legality of track arrangement. It shall be noted that a routing track is a fictitious line or line segment in a layout and is often used to implement an interconnect by aligning the centerline of the interconnect along the routing track and further by assigning and using the width value associated with the routing track as the width of the interconnect. A routing track does not, however, have any non-zero thickness because it is a fictitious line and is often identified from a set of manufacturing grids provided by semiconductor foundries.

In addition to determining a set of legal track patterns, some of the second embodiments further determine a set of legal device patterns. A legal device pattern includes a plurality of device designs arranged in such a way to satisfy one or more design rules or constraints according to the design requirements, design specification, or manufacturing requirements. A legal device pattern may further comply with one or more additional design rules or constraints that govern whether or how two legal device patterns of the same type or of different types may be placed immediately adjacent to each other. Various techniques described herein for legal device patterns apply to both the top-down approach starting with legal device patterns and the bottom-up approach starting with a plurality of devices. In the bottom-up approach, the layout may begin with a plurality of device designs, and these techniques may create a figure group as described above to manipulate the hierarchies in the layout by creating a figure group representing a legal device pattern and including the plurality of device designs.

SYSTEM ARCHITECTURE OVERVIEW

Figure 6:
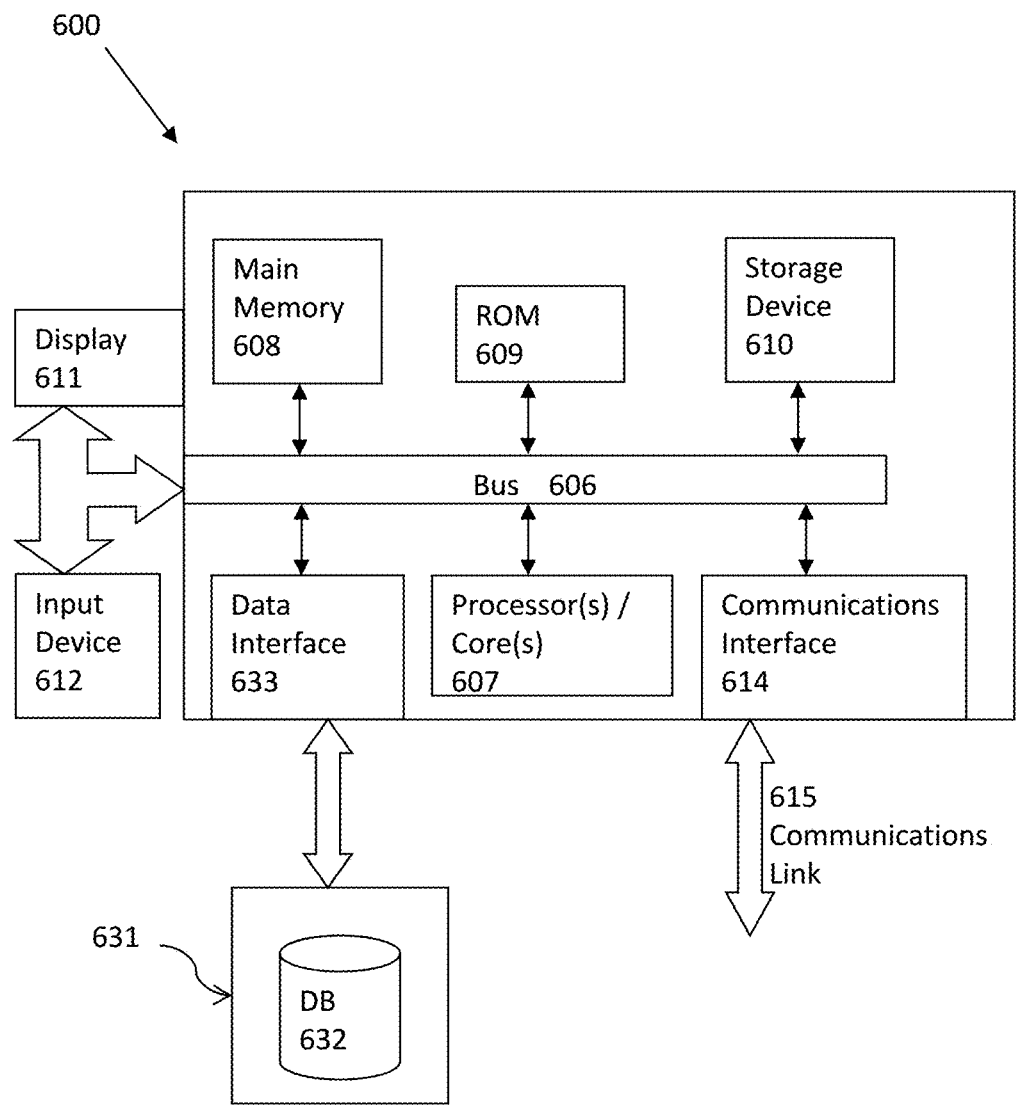
FIG. 6 illustrates a computerized system on which a method for implementing legal routing tracks across virtual hierarchies and legal placement patterns may be implemented.

FIG. 6 illustrates a computerized system on which a method for implementing legal routing tracks across virtual hierarchies and legal placement patterns may be implemented. Computer system 600 includes a bus 606 or other communication module for communicating information, which interconnects subsystems and devices, such as processor 607, system memory 608 (e.g., RAM), static storage device 609 (e.g., ROM), disk drive 610 (e.g., magnetic or optical), communication interface 614 (e.g., modem or Ethernet card), display 611 (e.g., CRT or LCD), input device 612 (e.g., keyboard), and cursor control (not shown). The illustrative computing system 600 may include an Internet-based computing platform providing a shared pool of configurable computer processing resources (e.g., computer networks, servers, storage, applications, services, etc.) and data to other computers and devices in a ubiquitous, on-demand basis via the Internet. For example, the computing system 600 may include or may be a part of a cloud computing platform in some embodiments.

According to one embodiment, computer system 600 performs specific operations by one or more processor or processor cores 607 executing one or more sequences of one or more instructions contained in system memory 608. Such instructions may be read into system memory 608 from another computer readable/usable storage medium, such as static storage device 609 or disk drive 610. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 607, where the one or more processors, one or more processor cores, or combination thereof executes one or more threads. For example, the acts of determination, extraction, stitching, simulating, annotating, analyzing, optimizing, and/or identifying, etc. may be performed by one or more processors, one or more processor cores, or combination thereof. In one embodiment, the parasitic extraction, current solving, current density computation and current or current density verification is done in memory as layout objects or nets are created or modified.

The term "computer readable storage medium" or "computer usable storage medium" as used herein refers to any non-transitory medium that participates in providing instructions to processor 607 for execution. Such a medium may take many forms, including but not limited to, non-volatile media and volatile media. Non-volatile media includes, for example, optical or magnetic disks, such as disk drive 610. Volatile media includes dynamic memory, such as system memory 608. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 600. According to other embodiments of the invention, two or more computer systems 600 coupled by communication link 615 (e.g., LAN, PTSN, or wireless network) may perform the sequence of instructions required to practice the invention in coordination with one another.

Computer system 600 may transmit and receive messages, data, and instructions, including program (e.g., application code) through communication link 615 and communication interface 614. Received program code may be executed by processor 607 as it is received, and/or stored in disk drive 610, or other non-volatile storage for later execution. In an embodiment, the computer system 600 operates in conjunction with a data storage system 631, e.g., a data storage system 631 that includes a database 632 that is readily accessible by the computer system 600. The computer system 600 communicates with the data storage system 631 through a data interface 633. A data interface 633, which is coupled to the bus 606 (e.g., memory bus, system bus, data bus, etc.), transmits and receives electrical, electromagnetic or optical signals that include data streams representing various types of signal information, e.g., instructions, messages and data. In embodiments of the invention, the functions of the data interface 633 may be performed by the communication interface 614.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

I claim:

1. A computer implemented method for implementing legal routing tracks across virtual hierarchies and legal placement patterns, comprising:
   executing, at a track management module coupled to a microprocessor of a computing system, a sequence of instructions to perform a process, the process comprising:
   identifying at least a layout or a portion thereof for an electronic design;
   identifying a plurality of layout devices in the layout or the portion thereof;
   generating, by at least the microprocessor, a figure group to create a legal device pattern at least by enclosing the plurality of layout devices within a boundary for the figure group; and
   modifying layout devices in a placement row in the legal device without disturbing compliance of one or more design rules with which the legal device pattern complies when generated.

2. The computer implemented method of claim 1, further comprising:
   invoking a placement engine to place the plurality of layout devices in the legal device pattern according to one or more placement rules; and
   identifying a plurality of layout devices spanning across multiple placement rows in the layout or the portion thereof, the multiple placement rows including the placement row.

3. The computer implemented method of claim 2, further comprising:
   identifying a set of design rules comprising at least the one or more design rules with which the legal device pattern complies when the legal device pattern is created, wherein
      the set of design rules govern legality of one or more first orders or arrangements of legal devices in one or more placement rows and legality of second orders or arrangements of legal devices in the multiple placement rows.

4. The computer implemented method of claim 3, further comprising:
   determining the boundary for the plurality of layout devices based in part or in whole upon the set of design rules.

5. The computer implemented method of claim 4, further comprising:
   identifying or creating a virtual hierarchy at which the legal device pattern is generated; and
   materializing the legal device pattern into a physical cell or block.

6. The computer implemented method of claim 5, further comprising:
   materializing the virtual hierarchy at which the legal device pattern is located into a physical hierarchy based in part or in whole upon materializing the legal device pattern into the physical cell or block.

7. The computer implemented method of claim 6, further comprising:
   altering a physical hierarchical structure of the layout or the portion thereof based in part or in whole upon materializing the legal device pattern into the physical cell or block.

8. A system for implementing legal routing tracks across virtual hierarchies and legal placement patterns, comprising:
   non-transitory computer accessible storage medium storing thereupon program code;
   at least one processor executing the program code to identify at least a layout or a portion thereof for an electronic design;
   one or more modules that are stored at least partially in memory of one or more computing systems, include or function in conjunction with at least one hardware processor of the one or more computing systems, and are configured to execute the program code to identify at least a layout or a portion thereof for an electronic design;
   the at least one processor further executing the program code to identify a plurality of layout devices in the layout or the portion thereof;
   the at least one processor further executing the program code to generate a figure group to create a legal device pattern at least by enclosing the plurality of layout devices within a boundary for the figure group; and
   the at least one processor further executing the program code to modify layout devices in a placement row in the legal device without disturbing compliance of one or more design rules with which the legal device pattern complies when generated.

9. The system for claim 8, the at least one processor further executing the program code at least further to:
   invoke a placement engine to place the plurality of layout devices in the legal device pattern according to one or more placement rules; and
   identify a plurality of layout devices spanning across multiple placement rows in the layout or the portion thereof, the multiple placement rows including the placement row.

10. The system for claim 9, the at least one processor further executing the program code at least further to:
    identify a set of design rules comprising at least the one or more design rules with which the legal device pattern complies when the legal device pattern is created, wherein
       the set of design rules govern legality of one or more first orders or arrangements of legal devices in one or more placement rows and legality of second orders or arrangements of legal devices in the multiple placement rows.

11. The system for claim 10, the at least one processor further executing the program code at least further to:

determine the boundary for the plurality of layout devices based in part or in whole upon the set of design rules.

12. The system for claim 11, the at least one processor further executing the program code at least further to:
identify or create a virtual hierarchy at which the legal device pattern is generated; and
materialize the legal device pattern into a physical cell or block.

13. The system for claim 8, the at least one processor further executing the program code at least further to:
materialize the virtual hierarchy at which the legal device pattern is located into a physical hierarchy based in part or in whole upon materializing the legal device pattern into the physical cell or block.

14. The system for claim 13, the at least one processor further executing the program code to:
alter a physical hierarchical structure of the layout or the portion thereof based in part or in whole upon materializing the legal device pattern into the physical cell or block.

15. An article of manufacture comprising a non-transitory computer accessible storage medium having stored thereupon a sequence of instructions which, when executed by at least one processor or at least one processor core executing one or more threads, causes the at least one processor or the at least one processor core to perform a set of acts for implementing legal routing tracks across virtual hierarchies and legal placement patterns, the set of acts comprising:
executing, at a track management module coupled to a microprocessor of a computing system, a sequence of instructions to perform a process, the process comprising:
identifying at least a layout or a portion thereof for an electronic design;
identifying a plurality of layout devices in the layout or the portion thereof;
generating, by at least the microprocessor, a figure group to create a legal device pattern at least by enclosing the plurality of layout devices within a boundary for the figure group; and
modifying layout devices in a placement row in the legal device without disturbing compliance of one or more design rules with which the legal device pattern complies when generated.

16. The article of manufacture of claim 15, the set of acts further comprising:
invoking a placement engine to place the plurality of layout devices in the legal device pattern according to one or more placement rules; and
identifying a plurality of layout devices spanning across multiple placement rows in the layout or the portion thereof, the multiple placement rows including the placement row.

17. The article of manufacture of claim 16, the set of acts further comprising:
identifying a set of design rules comprising at least the one or more design rules with which the legal device pattern complies when the legal device pattern is created,
wherein
the set of design rules govern legality of one or more first orders or arrangements of legal devices in one or more placement rows and legality of second orders or arrangements of legal devices in the multiple placement rows.

18. The article of manufacture of claim 17, the set of acts further comprising:
determining the boundary for the plurality of layout devices based in part or in whole upon the set of design rules;
identifying or creating a virtual hierarchy at which the legal device pattern is generated; and
materializing the legal device pattern into a physical cell or block.

19. The article of manufacture of claim 18, the set of acts further comprising:
materializing the virtual hierarchy at which the legal device pattern is located into a physical hierarchy based in part or in whole upon materializing the legal device pattern into the physical cell or block.

20. The article of manufacture of claim 19, the set of acts further comprising:
altering a physical hierarchical structure of the layout or the portion thereof based in part or in whole upon materializing the legal device pattern into the physical cell or block.

* * * * *